United States Patent
Nakamura et al.

(10) Patent No.: US 6,382,413 B1
(45) Date of Patent: May 7, 2002

(54) DISK HOLDER AND DISK STORAGE DEVICE

(75) Inventors: Akira Nakamura; Masahiko Fuyumura, both of Ashikaga; Kurao Habaya; Hiroshi Akou, both of Kawasaki; Tetsuya Sawano, Kawasaki, all of (JP)

(73) Assignees: Achilles Corporation, Tokyo; Fuji Electric Co., Ltd., Kawasaki, both of (JP)

(*) Notice: Subject to any disclaimer, the term of this patent is extended or adjusted under 35 U.S.C. 154(b) by 0 days.

(21) Appl. No.: 09/623,204

(22) PCT Filed: Apr. 20, 2000

(86) PCT No.: PCT/JP00/02563

§ 371 Date: Sep. 14, 2000

§ 102(e) Date: Sep. 14, 2000

(87) PCT Pub. No.: WO00/64785

PCT Pub. Date: Nov. 2, 2000

(30) Foreign Application Priority Data

Apr. 21, 1999 (JP) ............................. 11-114167
Aug. 11, 1999 (JP) ............................. 11-227733
Oct. 21, 1999 (JP) ............................. 11-300076

(51) Int. Cl.[7] ............................................ B65D 85/57
(52) U.S. Cl. ..................... 206/303; 206/307; 206/310
(58) Field of Search ................................. 206/303, 307, 206/308.3, 309, 310, 454, 709–711; 360/133; 369/291

(56) References Cited

U.S. PATENT DOCUMENTS

| 4,577,756 A | * | 3/1986 | Hennessy et al. ......... 206/308.3 |
| 4,779,724 A | * | 10/1988 | Benz et al. ................. 206/303 |
| 4,826,005 A | * | 5/1989 | Tajima et al. ............... 206/310 |
| 6,116,416 A | * | 9/2000 | Hansen et al. ........... 206/308.3 |

FOREIGN PATENT DOCUMENTS

| JP | 53-31970 | * | 3/1978 |
| JP | 62-139992 | * | 9/1987 |
| JP | 5-86163 | * | 5/1993 |
| JP | 2000-79979 | * | 3/2000 |
| JP | 2000-142866 | * | 5/2000 |

* cited by examiner

Primary Examiner—Jim Foster
(74) Attorney, Agent, or Firm—Kaensaka & Takeuchi

(57) ABSTRACT

A disk holder according to the present invention has a first core 1 and a second core 2. The cores are members having a given length with a generally U-shaped cross section and combined to oppose to each other so that adjustment of expansion and contraction of the cores can be carried out between an expanded diameter position and a contracted diameter position. The surfaces of the cores 1 and 2 are provided with rows of guides 7a and 7b and supports 8a and 8b. The row of the guides 7a and 7b forms flutes for receiving disks D one by one inbetween the guides to hold the disks at predetermined intervals. The supports 8a and 8b are projected rows for supporting the inner periphery of the axle hole of the disk by three-point support, the supports 8b being provided with resiliency. The holder 5 is inserted into the axle hole of the disk D at the contracted diameter position and supports a plurality of disks D, D, D . . . in a row at the expanded diameter position.

27 Claims, 28 Drawing Sheets

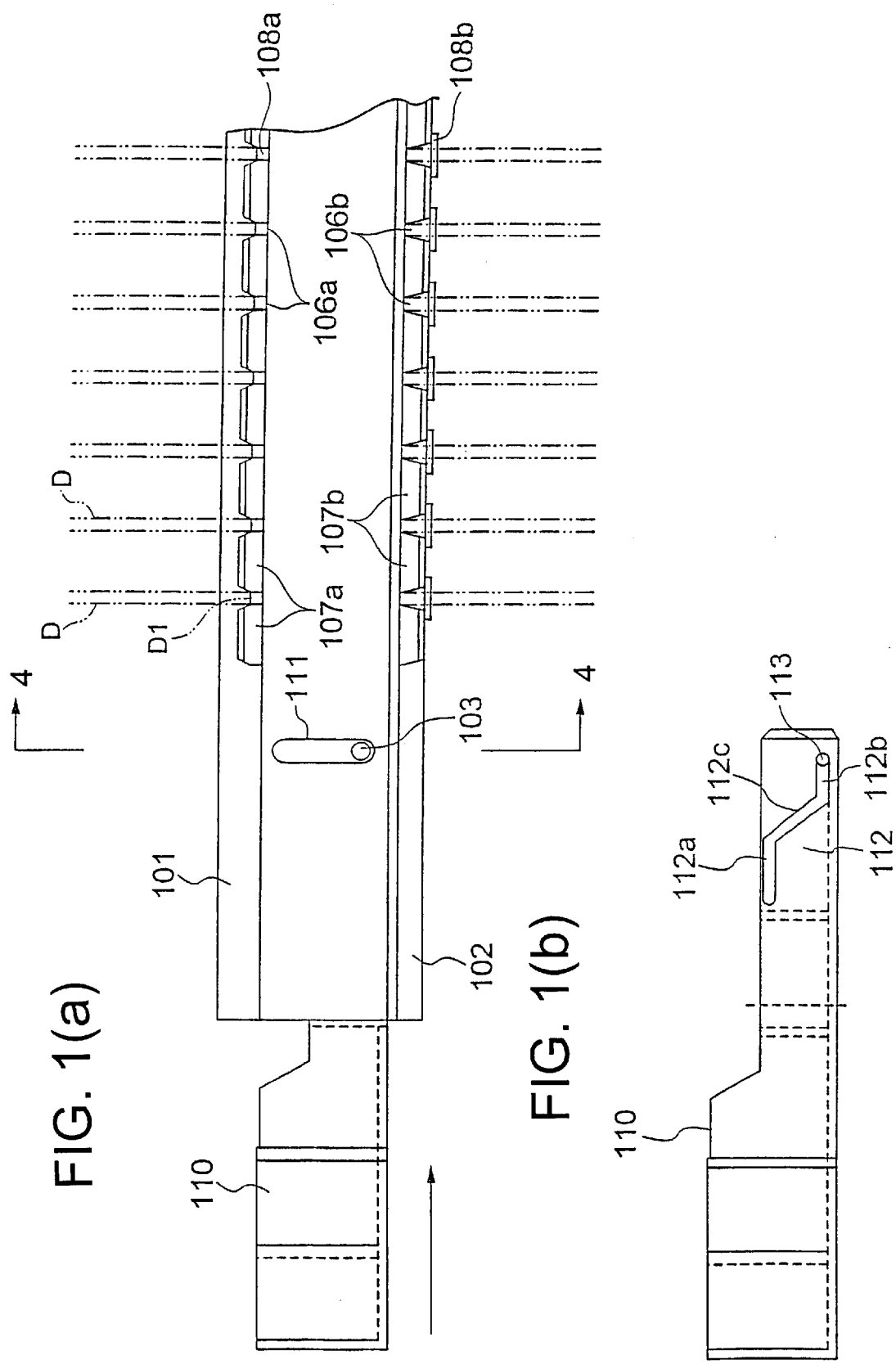

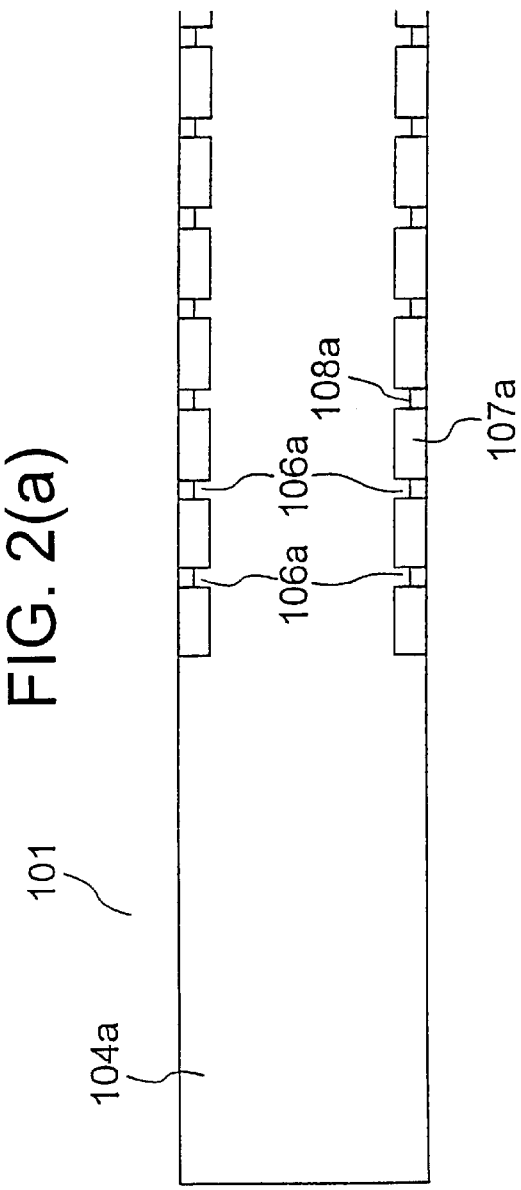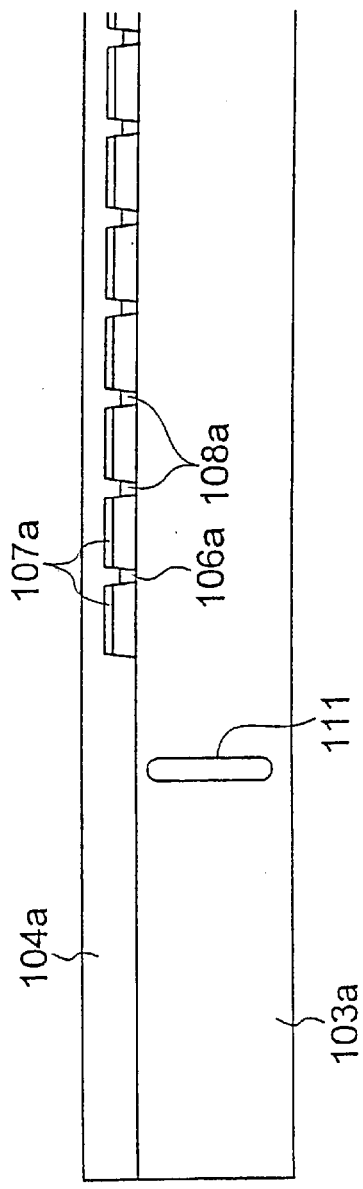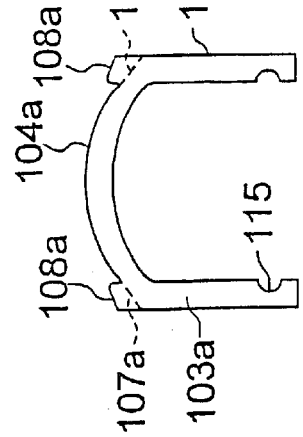

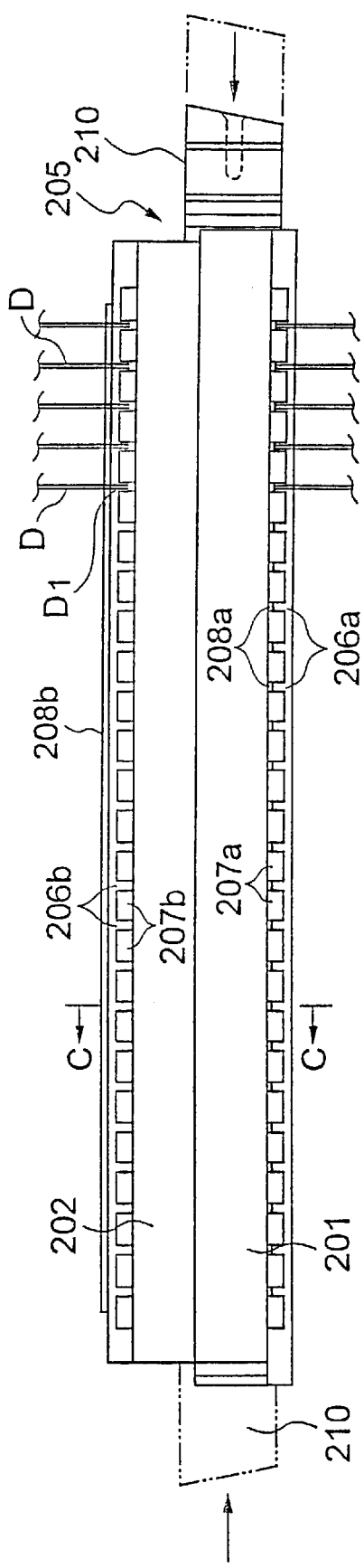
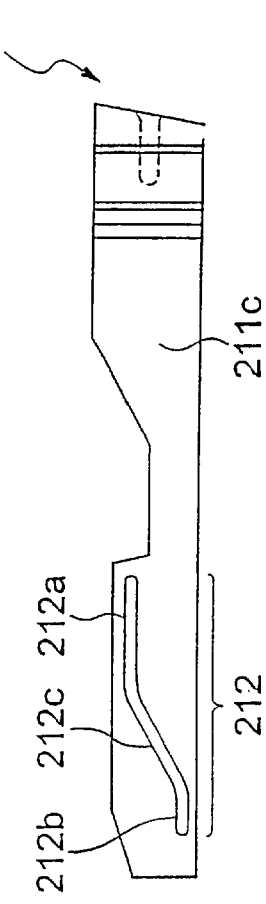
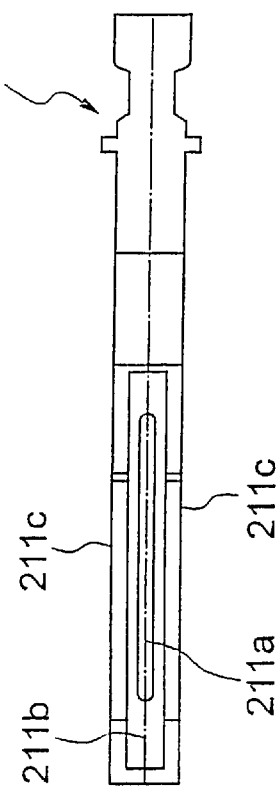
FIG. 8(a)
FIG. 8(b)
FIG. 8(c)

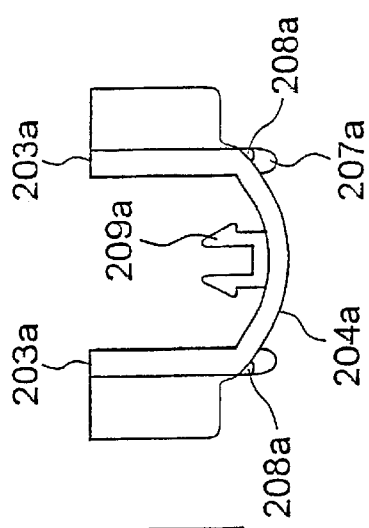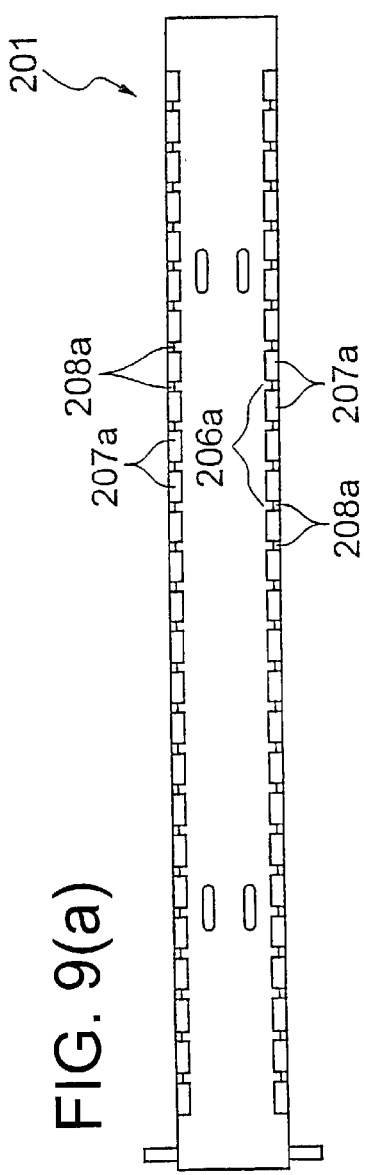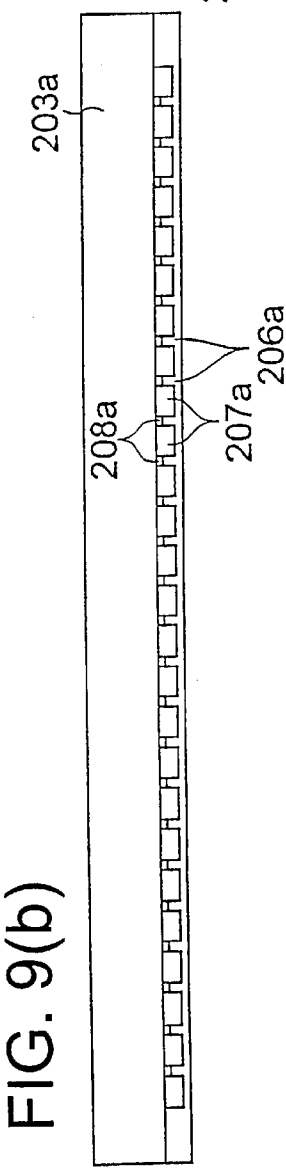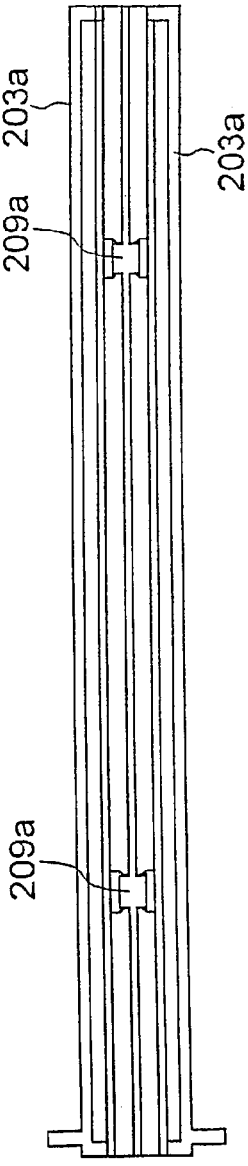

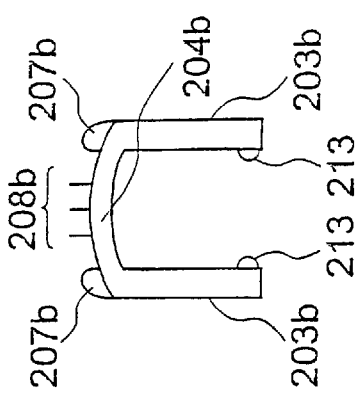
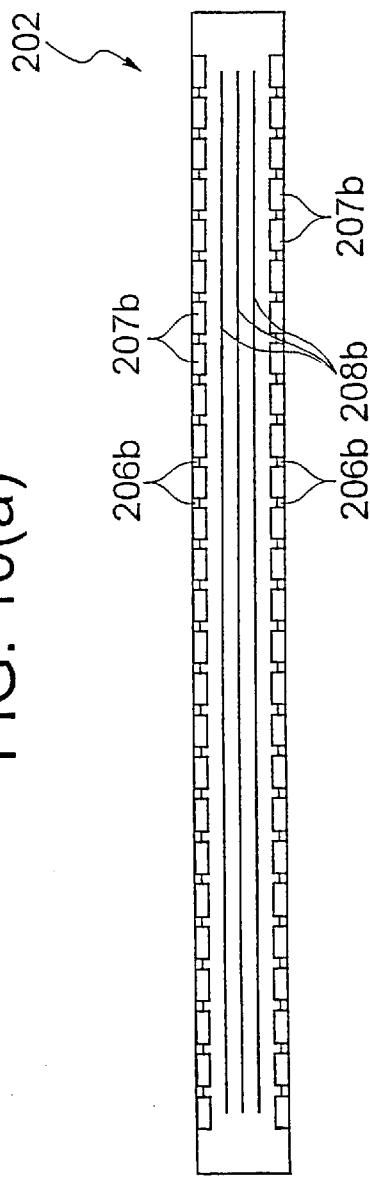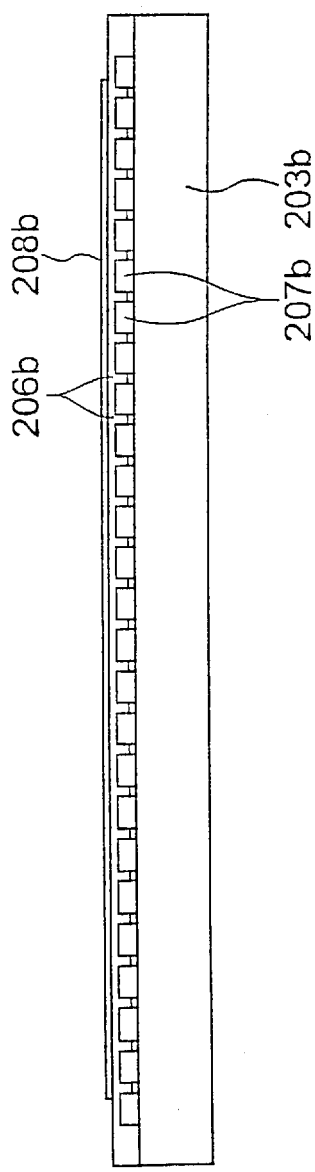

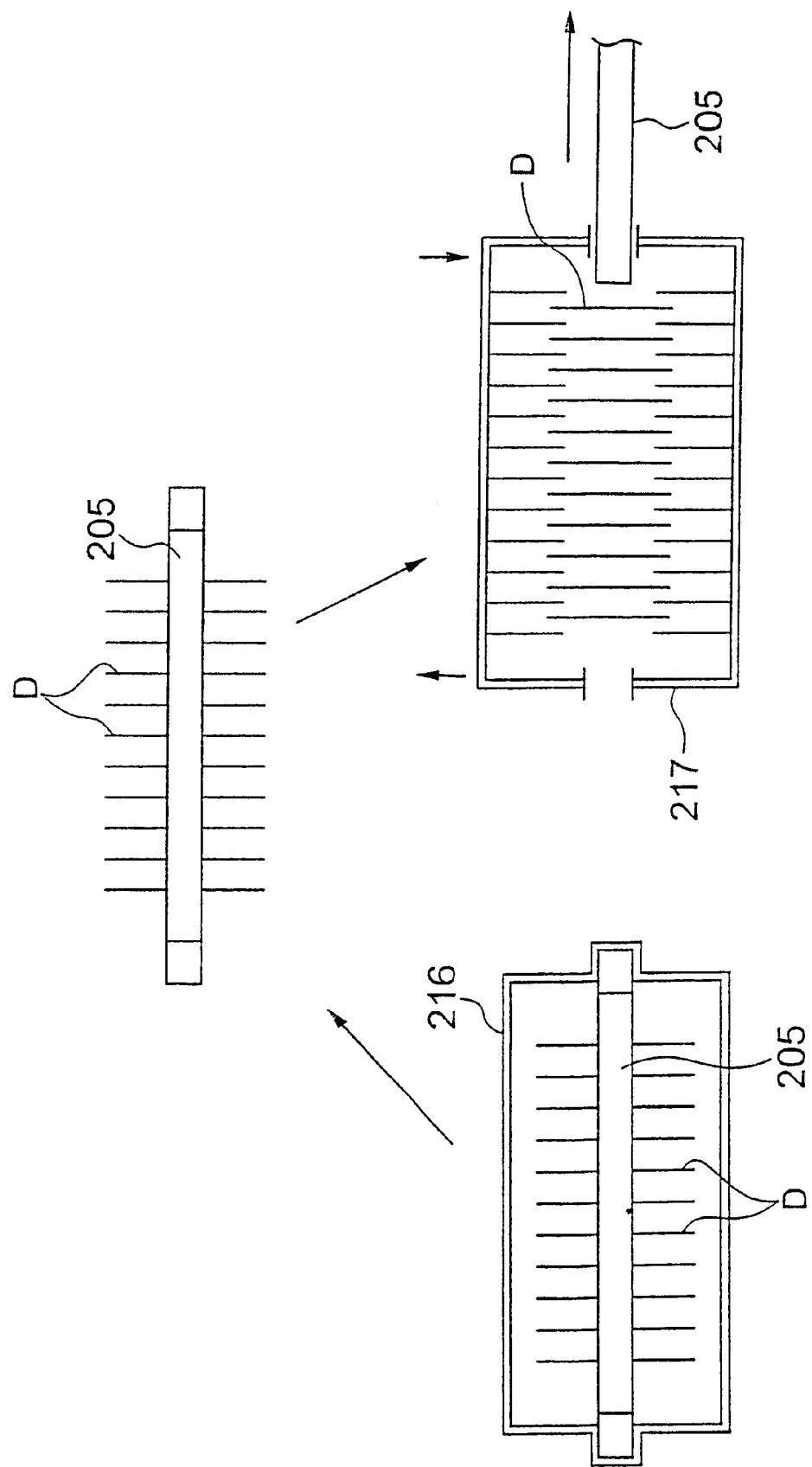

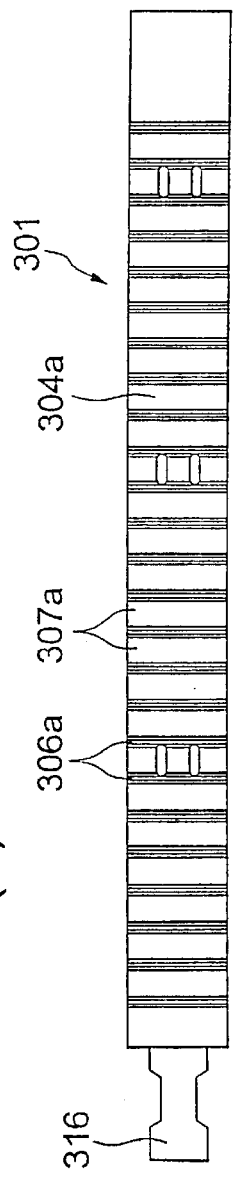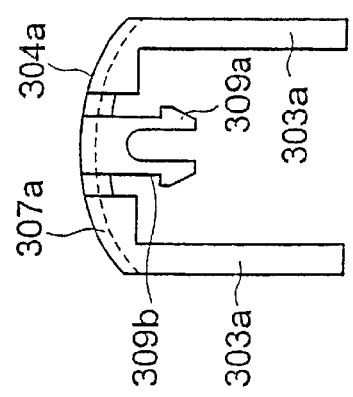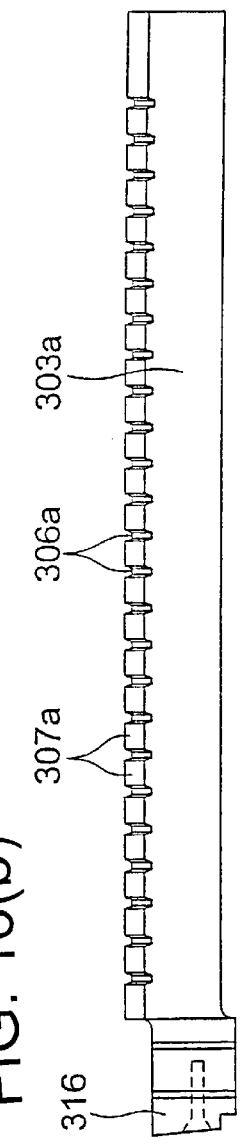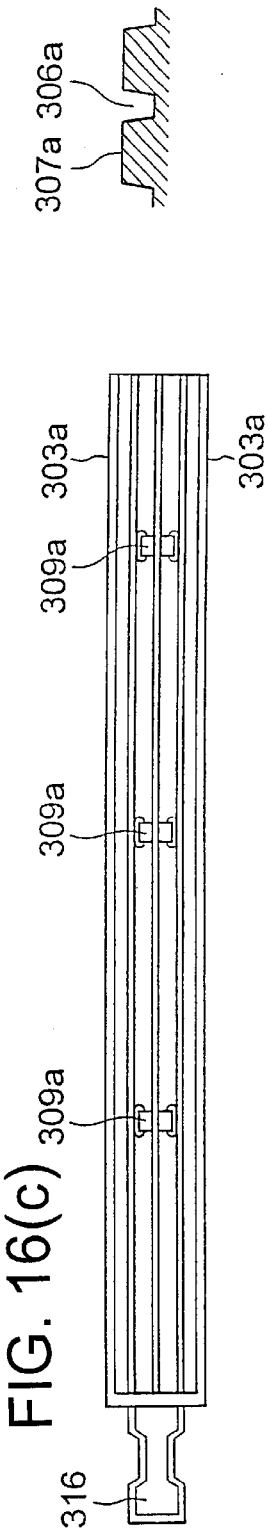
FIG. 16(a), FIG. 16(b), FIG. 16(c), FIG. 16(d), FIG. 16(e)

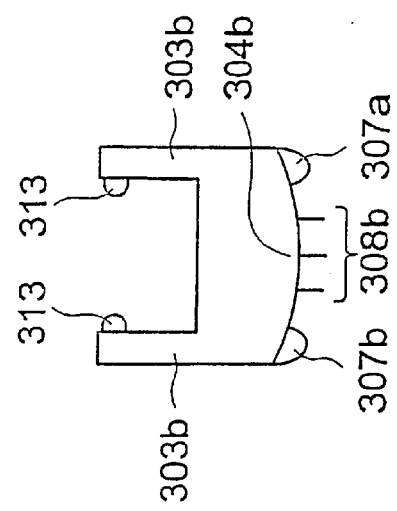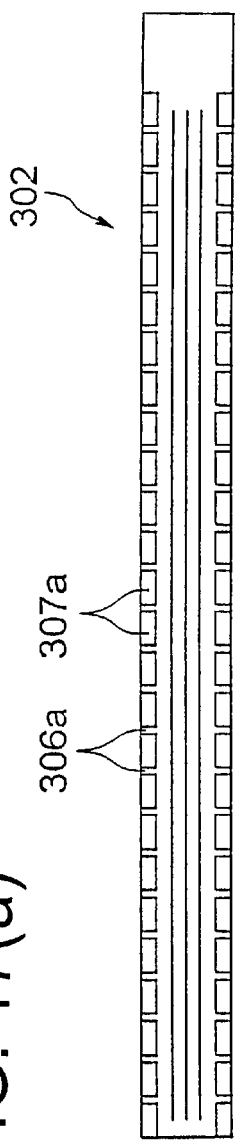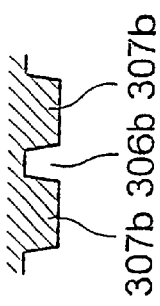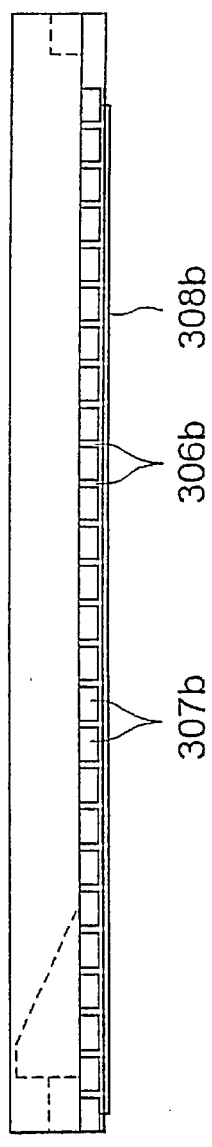

DISK HOLDER AND DISK STORAGE DEVICE

TECHNICAL FIELD

The present invention relates to disk holders for holding information storage media and, more particularly, to a disk holder for holding a plurality of disk-shaped (doughnut-shaped) storage disks with an axle hole at the center in parallel at regular intervals.

BACKGROUND OF THE INVENTION

A magnetic disk mounted on hard disk units, which is used as an external storage device of a computer, etc., requires the surface thereof to have an extremely high degree of flatness and cleanliness. It is required to keep the surface to a certain degree of cleanliness not only during transportation or storage but also during manufacturing.

Such products require extremely careful handling from putting the products into a case to taking the products out of the case.

For cases requiring such careful handling, Japanese Patent Publication No.Hei 5-55395 (prior art example 1) discloses a storage disk package. The storage disk package comprises a combination of an upper cover, a disk box, and a lower cover, adapted to seal a plurality of computer storage disks in a disk box and support the disks with them packaged.

The storage disk package of the prior art example 1 is used not only as an in-process case but also as a delivery case with storage disks accommodated therein.

However, when the disk box is covered with the upper cover and the lower cover, the upper cover and the lower cover of the storage disk package of the prior art example 1 are snapped into the opening rims of the disk box.

Accordingly, when the disk box is to be covered at the time of delivery, such a problem is raised that fitting the upper cover and the lower cover to the box causes dust particles produced by the friction of the members to be adhered to the surface of the storage disks in the box.

Japanese Laid-Open Patent Publication No.Hei 10-182846 (prior art example 2) pointed out the aforementioned problem and suggested a storage disk package that did not produce dust particles at the time of covering the disk box with an upper cover.

However, the package of the prior art example 2 is the same as the prior art example 1 in that the combination of the disk box, the lower cover, and the upper cover is used. The disk box has flutes for holding disks and a plurality of disks are accommodated in the disk box by being separated so as not to be in contact with each other and held in each of the holding flutes.

Therefore, even using the package according to the prior art example 2 cannot avoid the problem, so long as this package is used as a delivery case, that storage disks are held in the holding flutes inside the package, so that the outer circumference portions of the disks come to contact with the inner wall of the flutes and this cause dust particles and fine particles produced from the box possibly to adhere to the disks.

Thus, this raises the problem that the outer circumference portions of the disks in contact with the box cannot be used as the recording surface, preventing the amount of recorded information of the disk from being expanded.

On the other hand, U.S. Pat. No. 4,779,724 (prior art example 3) suggested a disk support member (a disk holder) of a mandrel type for supporting the axle hole of a disk.

The disk holder according to the prior art example 3 is inserted into the axle holed of disks accommodated in an in-process case to support the inner peripheries for supporting the disks at regular intervals in parallel to each other. Transferring this holder to a delivery case makes it possible to transport and store the disks without allowing the outer circumference portion of each of the disks to be in contact with the inner wall of the case.

As shown in FIG. 28, the prior art example 3 uses a pair of disk support members 621 and 622 (a first core and a second core) combined into a cylinder.

Each of the disk support members 621 and 622 is provided, on the arc-shaped surface thereof, with a number of arc-shaped flutes 623. The axle hole D1 of the disk D is received in the arc-shaped flutes 623 at a contracted diameter position where the spacing between both the disk support members 621 and 622 is narrowed. Then, the flutes 623 are pressed against the inner periphery of the axle hole D1 of the disk D at the expanded diameter position where the spacing between both the disk support members 621 and 622 is widened. Thus, by making use of the expanding force of both the disk support members 621 and 622, each of the disks D is fixed onto the circumference of the holder.

The manipulation for switching the paired disk support members 621 and 622 from the contracted diameter position to the expanded diameter position, or conversely, from the expanded diameter position to the contracted diameter position is carried out by pushing in or pulling out the paired cam actuators 624 each inserted into the cylinder of the holder formed by the combination of the disk support members 621 and 622 through the both ends thereof.

The cam actuators 624 used in the prior art example 3 have pins 626 on a slide shaft 625. The pins 626 are inserted into the cam grooves 627 and 628 formed on the paired disk support members 621 and 622. The slide shaft 625 is pushed into the cylinder of the disk holder to expand the paired disk support members 621 and 622 to the expanded diameter position, while the slide shaft 625 is pulled out of the cylinder to contract the disk support members 621 and 622 to the contracted diameter position.

That is, according to the prior art example 3, the manipulation for expanding or contracting the holder is carried out by sliding the paired cam actuators, which are inserted into the cylinder from the both ends of the holder, along the longitudinal direction of the holder. Pushing in the cam actuators 624 causes the holder (621 and 622) to expand in diameter and pulling out the cam actuators 624 causes the holder to contract in diameter. However, the expansion and contraction of the diameter of the holder is carried out by expanding and contracting the paired disk support members 621 and 622. Accordingly, with both the cam actuators of the holder held by hands, pulling out or pushing in one cam actuator will cause, dynamically, the reaction of the force to act on the other cam actuator, so that the other cam actuator is displaced relative to the holder to be pulled out of the holder or to be pushed into the holder. However, with the paired disk support members (the first core and the second core) of the holder held in place or subjected to resistance in the longitudinal direction, the reaction that is the same in magnitude as the force produced when one cam actuator is pulled or pushed is not necessarily applied to the other cam actuator.

For this reason, when the expanded diameter and contracted diameter of the holder are switched over by means of a robot, such a problem is raised in that the first core and the second core can be balanced with difficulty and thus cannot be kept parallel to each other, making it difficult to expand or contract the diameter smoothly.

Furthermore, cam grooves are provided near the both ends of the holder. Accordingly, when the manipulation for expanding the spacing between the first core and the second core is carried out by means of the pins engaging the cam grooves, both end portions of the first core and the second core are supported by pins and thus both end portions of the first core and the second core can support disks in a stable state. However, the central portion of the first and second cores is not supported by any means, so that such a problem is raised in that this causes deflection to be produced in the first and second cores, thereby making the support of the disks unstable.

The object of the present invention is to provide a disk holder that facilitates the switching manipulation for expansion and contraction of the diameter and provides improved stability of holding disks.

DISCLOSURE OF THE INVENTION

In order to achieve the aforementioned object, the disk holder according to the present invention is a disk holder which comprises a first core and a second core, which is inserted into an axle hole of a disk, and which supports a plurality of disks at intervals in a row, wherein all cores are members having a given length with a generally U-shaped cross section and combined to oppose each other so that adjustment of expansion and contraction of the cores can be carried out between an expanded diameter position and a contracted diameter position, the expanded diameter position is a position where an inner periphery of an axle hole of a disk is supported by part of a circumference surface of the holder, the contracted diameter position is a position where the holder is inserted into and withdrawn from the axle hole of the disk, rows and supports of guides are provided on an outer surface of each of the cores, the rows of the guides are to form flutes for, supporting disks at predetermined intervals by receiving the disks one by one inbetween the guides, and the supports are projected rows for supporting the inner periphery of the axle hole of each of the disks by multi-point (preferably three-point) support.

Furthermore, the disk holder according to the present invention is a disk holder which comprises a first core and a second core, which is inserted into an axle hole of a disk, and which supports a plurality of disks at intervals in a row, wherein the first and second cores each are members having a given length with a generally U-shaped cross section and combined to oppose each other so that adjustment of expansion and contraction of the cores can be carried out between an expanded diameter position and a contracted diameter position, the expanded diameter position is a position where an inner periphery of an axle hole of a disk is supported by part of a circumference surface of the holder, the contracted diameter position is a position where the holder is inserted into and withdrawn from the axle hole of the disk, rows and supports of guides are provided on an outer surface of each of the cores, the rows of the guides are to form flutes for supporting the disks at predetermined intervals by receiving the disks one by one inbetween the guides, the supports comprise rigid supports and elastic supports, the rigid supports are to be brought into contact with part of the inner periphery of the axle hole of each of the disks, and the elastic supports have deflectivity and deflect to be deformed by being subjected to weight and act repulsive force caused by the deformation upon the inner diameter of the axle hole of the disk.

Furthermore, the disk holder according to the present invention is a disk holder which comprises a first core, a second core, and a cam actuator, which is inserted into an axle hole of a disk, and which supports a plurality of disks at intervals in a row, wherein the first and second cores each are members having a given length with a generally U-shaped cross section and cylindrically combined to oppose each other so that adjustment of expansion and contraction of the outer peripheries can be carried out between an expanded diameter position and a contracted diameter position, the expanded diameter position is a position where an inner periphery of an axle hole of a disk is supported by part of a circumference surface of the holder, the contracted diameter position is a position where the holder is inserted into and withdrawn from the axle hole of the disk, rows of guides are provided on an outer surface of each of the cores, the rows of the guides are to form flutes for supporting the disks at predetermined intervals by receiving the disks one by one inbetween the guides, the cam actuator is to be supported by the first core and inserted movably into a cylinder of the holder, into which the first and second cores are combined, in the longitudinal direction, support the second core at two or more points, keep the cores parallel to each other, and switch the combination of the first core and the second core between the expanded diameter position and the contracted diameter position.

Furthermore, the disk holder according to the present invention is a disk holder having a combination of a core, supports, and a cam actuator, to support a plurality of disks in parallel, the core is a holder portion to be inserted into axle holes of two or more disks, the supports have projected rows and a resilient portion, the projected rows are portions to be protruded in the shape of rib from inside the core to outside the core to support the inner periphery of the axle hole of the disk holders, provided on the resilient portion, the resilient portion is made of an elastic material and has a self-restoring property, and the cam actuator forcibly deforms the resilient portion to allow the projected rows to protrude out of the core and conversely, releases the forced deformation of the resilient portion to allow the projected rows to retract into the core.

Furthermore, the disk holder according to the present invention is a disk holder having a combination of a core, supports, and a cam actuator, to support a plurality of disks in parallel, the core is a holder portion to be inserted into axle holes of two or more disks, having a guide surface of the resilient portion inside the core, the projected rows are portions to protrude in the shape of rib from inside the core to outside the tore to support the inner periphery of the axle hole of the disks, provided on the resilient portion, the resilient portion is an elastic material having a curved surface bent in the shape of an arc, having a self-restoring property, and inserted in the core, and the cam actuator presses the curved surface of the resilient portion against the guide surface of the core to forcibly deform the shape of the curved surface to allow the projected rows to protrude out of the core and conversely, releases the forced deformation of the resilient portion to allow the projected rows to retract into the core.

Furthermore, the disk holder according to the present invention is a disk holder having a combination of a core, supports, and a cam actuator, to support a plurality of disks in parallel, the core is a cylinder having a curved surface on an inner surface of an axle hole and has slits :in the axial direction, the supports have projected rows and a resilient portion, the projected rows are portions to protrude in the shape of rib from inside the core onto a circumference of the core through the slits to support the inner periphery of the axle hole of the disks, the resilient portion is made of an elastic material having a curved surface in the shape of an arc in a cross section thereof and has a self-restoring property and is inserted into the axle hole of the core, the curved surface of the resilient portion is greater in radius than the axle hole of the core, and the projected rows are provided on a convex surface of the curved surface of the resilient portion, and the cam actuator is inserted into the axle hole of the core at least from an opening on one end of the core and forcibly deforms the curved surface of the resilient portion along the curved surface of the axle hole of the core to allow the projected rows to protrude onto the circumference of the core, and conversely, is drawn out of the core and releases the resilient portion to allow the projected rows to retract into the core.

Furthermore, the disk container according to the present invention is a disk container having a combination of a box and a holder, wherein the box is a hollow container which can be opened and closed, provided inside the box with a hollow portion big enough to accommodate disks, and having bearing portions for holding the holder, the holder is to hold a plurality of disks in a row by being inserted into axle holes of the disks, and both ends of the holder are suspended in the hollow portion of the box by being held on the bearing portions of the box, and the disks held on the holder are accommodated in the hollow portion of the box without being in contact with an inner wall of the box.

BRIEF DESCRIPTION OF THE DRAWINGS

FIG. 1(a) is a view of a disk holder showing disks held on a holder relating to embodiment 1 of the present invention; FIG. 1(b) is a view showing a cam groove of a cam actuator.

FIG. 2(a) is a top plan view showing a first core; FIG. 2(b) is a side view; and FIG. 2(c) is an end view.

FIG. 8(a) is a view of a disk holder showing disks held on a holder relating to embodiment 2 of the present invention; FIG. 8(b) is a side view showing a cam actuator; and FIG. 8(c) is a plan view showing the cam actuator.

FIG. 9(a) is a bottom view showing a first core; FIG. 9(b) is a side view; FIG. 9(c) is a plan view; and FIG. 9(d) is an enlarged end view.

FIG. 10(a) is a plan view showing a second core; FIG. 10(b) is a side view; and FIG. 10(c) is an end view.

FIG. 14 is a view showing how to transfer disks by using a holder of the present invention from a delivery case to an in-process case.

FIG. 16(a) is a bottom plan view showing a first core; FIG. 16(b) is a side view; FIG. 16(c) is a plan view; FIG. 16(d) is an enlarged end view; and FIG. 16(e) is an enlarged cross-sectional view.

FIG. 17(a) is a plan view showing a second core; FIG. 17(b) is a side view; FIG. 17(c) is an end view; and FIG. 17(d) is an enlarged cross-sectional view showing a guide.

BEST MODE OF THE INVENTION

Figure 3A:
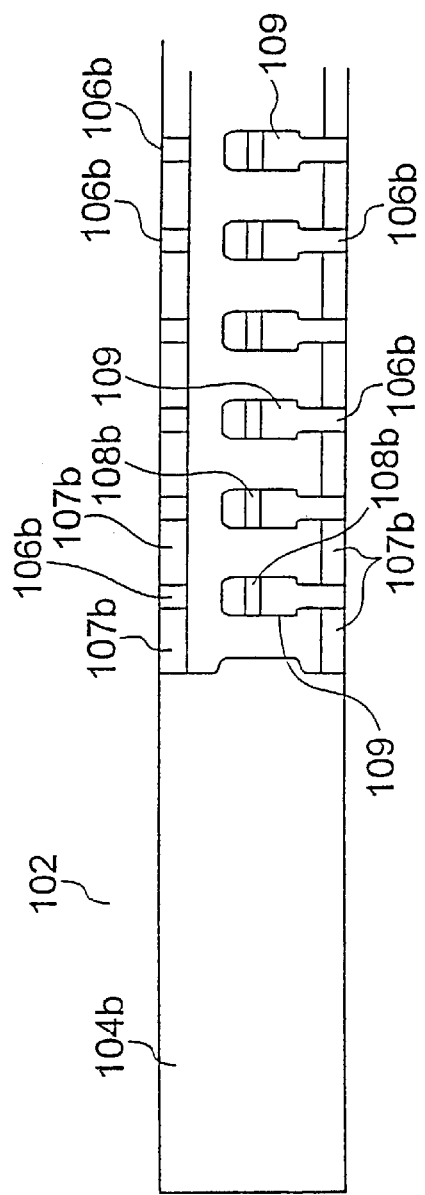
FIG. 3(a) is a bottom plan view showing a second core.

The embodiments of the present invention will be explained below with reference to the drawings. In the drawings, in case the drawing contains sub characters, e.g. FIGS. 1(a) and 1(b), if the drawing includes only numeral, e.g. FIG. 1, the drawing includes all the figures. Namely, FIG. 1 means FIGS. 1(a) and 1(b).

Embodiment 1

Referring to FIG. 1, for example, the disk holder according to embodiment 1 of the present invention is inserted into axle holes D1 of magnetic disks (hereinafter referred to as disks) D, D . . . , which are mounted on hard disks to be used as external storage units of a computer, in order to support a plurality of disks D, D . . . at intervals from each other in juxtaposition, comprising an assembly of a first core 101 and a second core 102.

Figure 3B:
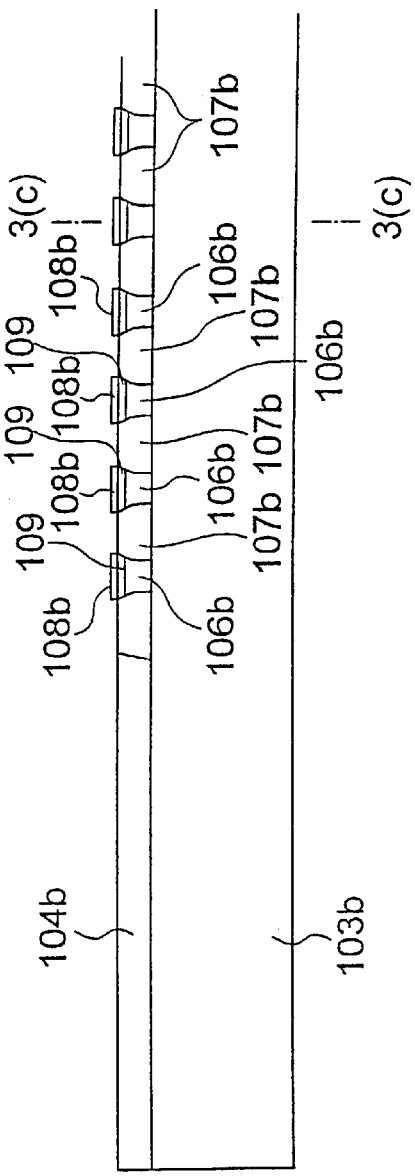
FIG. 3(b) is a side view.
Figure 3C:
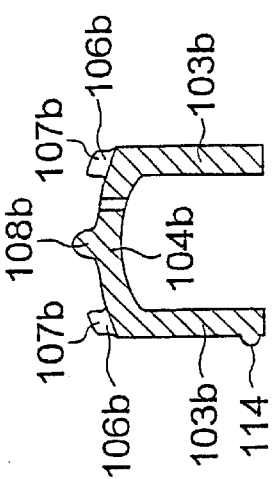
FIG. 3(c) is a cross-sectional view taken along line 3(c)—3(c) of FIG. 3(b).

Referring to FIGS. 2 and 3, the first and second cores 101 and 102 and a cam actuator 110 of FIG. 1 can be made of synthetic resin, which is normally used for the formation of synthetic resin by means of injection molding, such as polypropylene, polyethylene terephthalate, acrylonitrile butadiene styrene copolymer, polyphenylene oxide, and polycarbonate, and should only have such a level of rigidity such that when holding the disks, the molds are not deformed due to deflection caused by the weight of the disks to prevent the adjacent disks from being brought into contact with each other.

In addition, in order to prevent damage to the disks caused by the occurrence of static electricity, adhesion of dust particles or the like, the synthetic resin may be formed by blending in advance with an anti-static material such as carbon powder, metallic powder, conductive fabrics, or an anti-static agent to prevent static electricity from developing on the cores 101, 102, and the like.

The prevention of occurrence of static electricity may be implemented by providing the surface of a mold, after molded, with a conductive polymer layer such as of polypyrrole. At this time, the surface resistivity may be preferably $10^{12} \Omega/\square$ or less for prevention of electrification.

Each of the cores has leg portions (the leg portions of the first core are referred to as 103a to be distinguished from the leg portions of the second core denoted as 103b), a curved surface portion (the curved surface portion of the first core is referred to as 104a to be distinguished from the curved surface portion of the second core denoted as 104b), and is a bar member having a constant length (a length that is received in an in-process case or a delivery case, for accommodating a plurality of disks D) and a generally U-shaped cross section.

Figure 4:
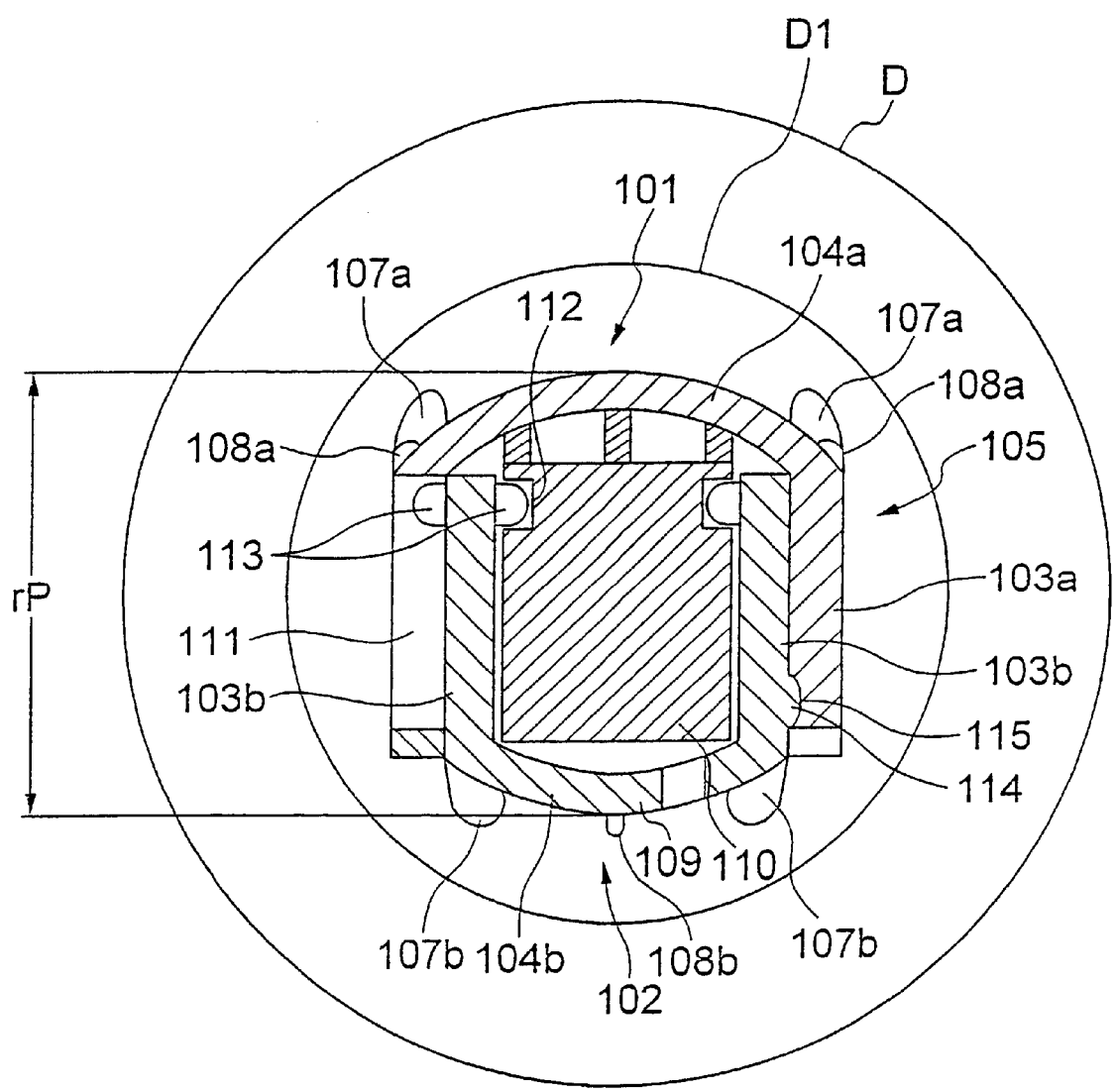
FIG. 4 is an enlarged cross-sectional view showing a portion corresponding to line 4—4 of FIG. 1(a), showing the contracted diameter position of a holder.

The leg portions are formed in a pair. The width between the leg portions 103a and 103a of the first core 101 is greater than that between leg portions 103b and 103b of the second core. As shown in FIG. 4, the leg portions 103b and 103b of the second core are allowed to fit within the leg portions 103a and 103a of the first core 101, facing each other, such that the combination allows the contraction and expansion to be adjusted.

Figure 5:
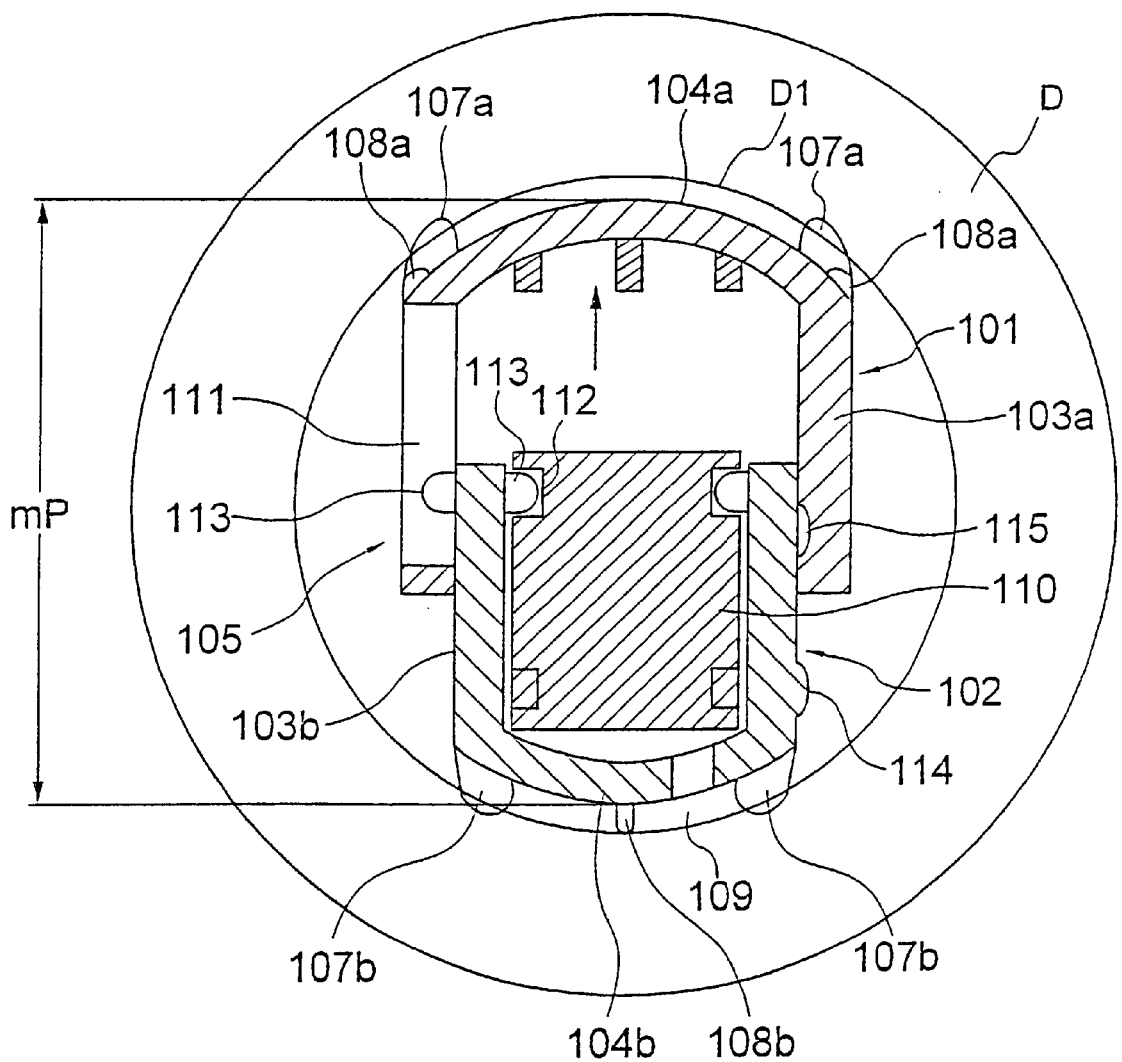
FIG. 5 is an enlarged cross-sectional view showing a portion similar to FIG. 4, showing the expanded diameter position of a holder.

That is, the first core 101 and the second core 102 are allowed to face each other and are combined with each other such that the cores can be expanded and contracted within the range between the contracted diameter position rP shown in FIG. 4 and the expanded diameter position mP shown in FIG. 5.

In the present invention, the expanded diameter position mP is the position at which the inner diameter of the axle hole of the disk D is supported, while the contracted diameter position rP is the position at which a holder 105 comprising the pair of the cores 101 and 102 is withdrawn from or inserted into the axle hole D1 of the disk D.

Referring to FIG. 5, the curved surface portions 104a and 104b of each of the cores 101 and 102, combined with each other, are formed in the shape of arcs having the same radius so as to sit on the same circumference at the expanded diameter position mP.

Moreover, the first and second cores 101 and 102 have, on the external surface thereof, rows of guides (the first guides are referred to as 107a to be distinguished from the second guides denoted as 107b) and supports (the supports of the first core are referred to as 108a to be distinguished from the supports of the second core denoted as 108b).

The supports are projected rows for supporting the inner periphery of the axle hole of the disk D, while the rows of guides have flutes 106a or 106b formed inbetween the guides, for holding a plurality of disks D at predetermined intervals as shown in FIG. 1 (refer to FIGS. 2 and 3).

The first core 101 has two rows of supports 108a and the second core 102 has a row of support 108b, which are set to such a height as to support the inner periphery of the axle hole of the disk D on a position of the same circumference at the expanded diameter position mP of both cores 101 and 102 coupled to each other.

In addition, at the expanded diameter position shown in FIG. 5, the mutual positional relationship between the respective supports is desirably set so that the angles of opening between the adjacent supports 108a and 108b, 108a and 108a have 120°. However, such a configuration is employed in which the cores have a generally U-shaped cross-sectional shape and the two cores are combined with each other to be expanded or contracted to fit into the inner periphery of the axle hole of a disk and the like. Accordingly, the angle of opening between the supports 108a and 108a tends to become less than that between the supports 108a and 108b. Therefore, it is desirable to arrange the respective supports so that each of the angles of opening becomes close to 120°.

However, in embodiment 1 of the present invention, the rows of the guides 107a of the first core 101 and the supports 108a are formed at the same positions on both ends of the curved surface portion 104a. Therefore, the supports 108a are to be formed inside the flutes 106a of the rows of the guides 107a.

Figure 6:
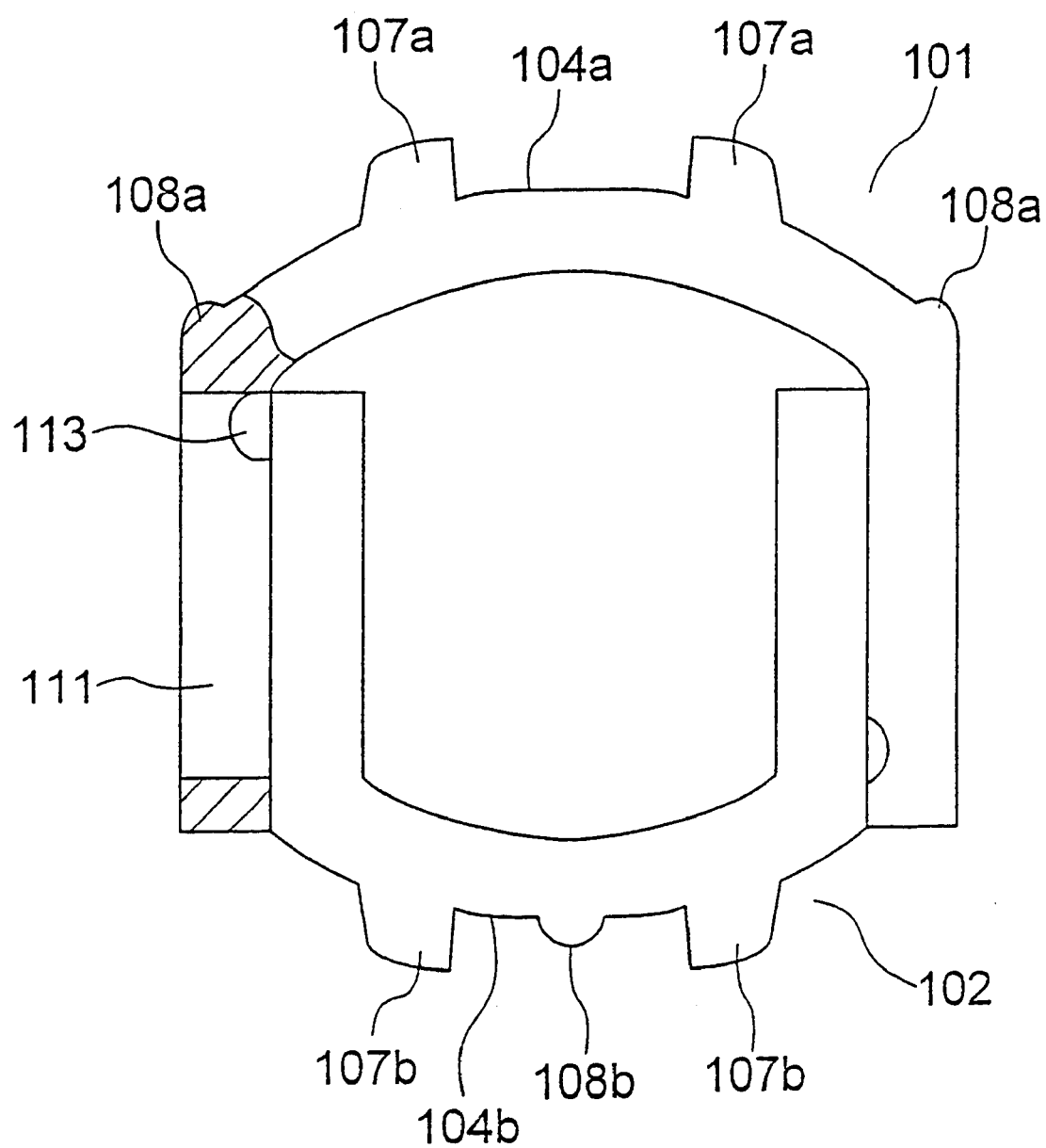
FIG. 6 is an enlarged cross-sectional view showing a portion similar to FIG. 4, showing another modified embodiment of embodiment 1 of the present invention.

However, the rows of the guides 107a of the first core 101 and the supports 108a need not necessarily be formed at the same position. As shown in FIG. 6, the rows of the guides 107a of the first core 101 and the supports 108a can also be formed at positions different from each other on the curved surface portion 104a. Alternatively, the first core 101 may be provided with a row of support 108a and the second core 102 may be provided with two rows of supports 108b.

On the other hand, as shown in FIG. 3, notches are provided at positions corresponding to flues 106b between the rows of the guides 107b on the curved surface portion 104b between the guides 107b and 107b of the second core 102 in which supports 108b are formed, leaving tongue-shaped portions 109 thereon.

This provides the tongue-shaped portions 109 with repulsive elasticity caused by the rigidity that the material of the core has and the configuration of the tongue piece. Thus, a force is applied to the support 108b, which is provided across the tongue-shaped portions 109, to be pressed against the inside of the core, thereby allowing a repulsive force to act against the force and thus enabling more strongly holding of the storage disks.

In this respect, the configuration shown in FIG. 3 can be said to be effective. As a matter of course, such a configuration may be provided on the first core 101. Alternatively, in order to increase the force for holding the disks, the supports 108a and 108b may be formed of a material other than that of the cores or the like. As the material to be used for this purpose, a material that has repulsive elasticity against compressive force may be used.

The first core 101 and the second core 102 are switched between the expanded diameter position mP and the contracted diameter position rP by means of the cam actuator 110 that is inserted within the opening at the both ends thereof.

That is, in FIGS. 4 and 5, a slit 111 opening in the vertical direction on the leg portion 103a of the first core 101 allows cam pins 113 fixed to the leg portion 103b of the second core 102 to engage the slit 111 and a cam groove 112 of the cam actuator 110.

As shown in FIG. 1(b), the cam groove 112 of the cam actuator 110 comprises horizontal portions 112a and 112b on the upper and lower portions, which provide the expanded diameter position mP and the contracted diameter position rP, and an inclined portion 112c that connects between both the horizontal portions 112a and 112b. The holder 105 comes to the expanded diameter position mP where the cam actuator 110 is pushed most deeply into the holder 105, whereas the holder 105 comes to the contracted diameter position rP where the cam actuator 110 is withdrawn outwardly out of the holder 105.

Furthermore, there are provided a projected portion 114 for securing the holder 105 in place when the holder 105 comes to the contracted diameter position rP and a recessed portion 115 for fitting with the projected portion 114, on the corresponding positions on the leg portions 103a and 103b.

In embodiment 1 of the present invention, the cam actuator 110 is withdrawn out of the holder 105 with the holder 105 kept at the contracted diameter position rP and inserted into the axle hole D1 of the disk D. Then, a plurality of disks D, D . . . are inserted onto the holder 105 and then the cam actuator 110 is pushed from the both ends of the holder 105 therein.

This allows the holder 105 to be expanded and the disks D, D . . . each are guided by the rows of the guides 107a and 107b formed on the respective cores to be received into the flutes 106b between the guides 107b and 107b and into the flutes 106a between the guides 107a and 107a. In addition, the disk D is supported in place by the three-point support of the supports 108a and 108a in the respective flutes 106a on each of the rows of guides 107a and which are provided on the both shoulders of the first core 101, and the support 108b of the second core 102.

The supports 108a of the first core 101 are fixed projected rows, while the support 108b of the second core 102 is formed on the tongue-shaped portion 109. Since the tongue-shaped portion 109 is provided by the hinge action with resiliency that the material of the core has, the inner periphery of the axle hole of the disk D is supported in a stable state against the resiliency that the core has.

Figure 7:
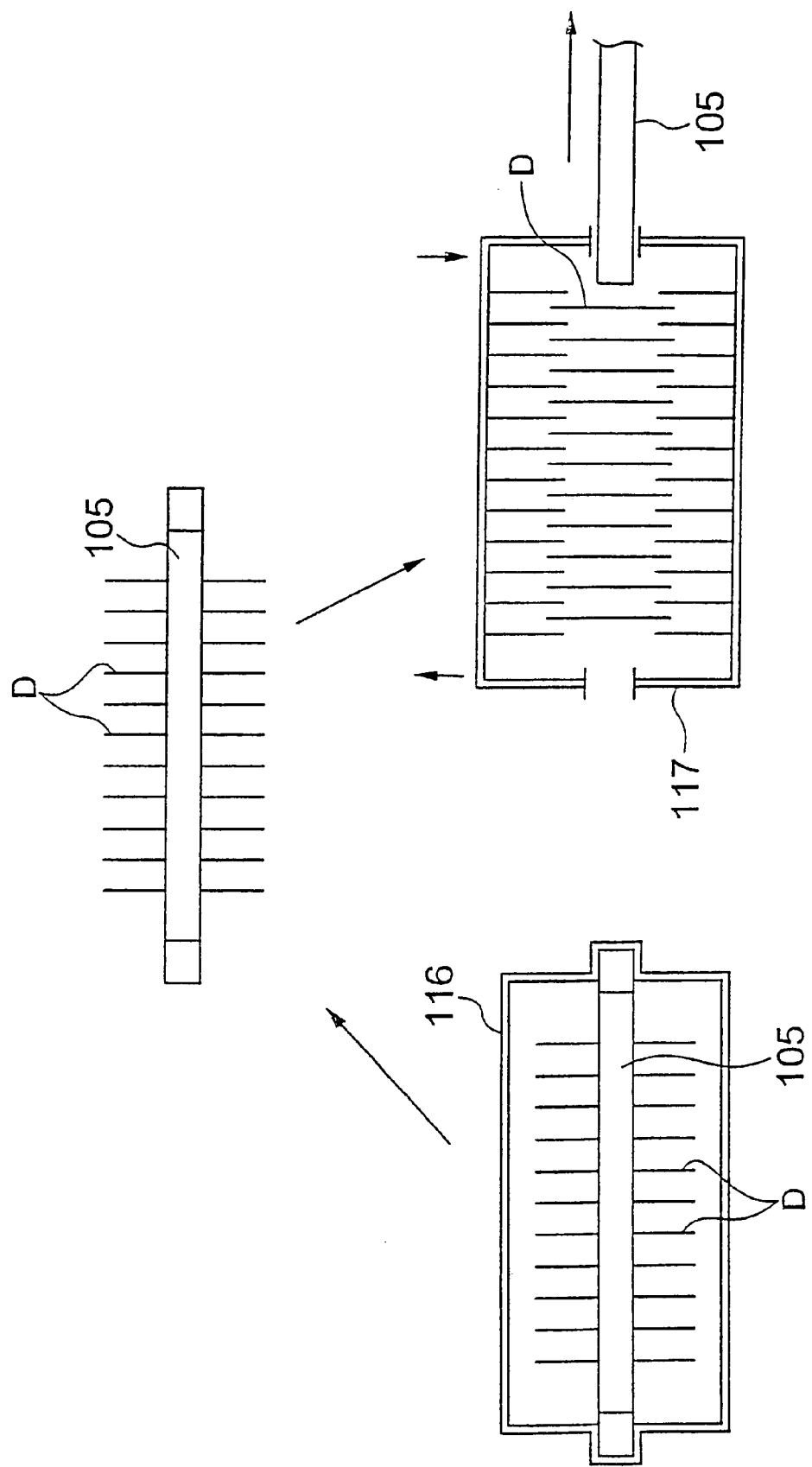
FIG. 7 is a view showing how to transfer disks by using a holder of the present invention from a delivery case to an in-process case.

Referring to FIG. 7, an in-process case 117 employs a container with flutes provided for holding disks on the inner wall, while a delivery case 116 employs a hollow container without the holding flutes on the inner wall.

When a plurality of disks D, D . . . are delivered, rows of disks D are held on the holder 105 and the holder 105 is suspended with the both ends thereof supported by the delivery case 116 to accommodate the rows of the disks D in the case. Thus, the case is stored or transported without the peripheral portion of the disks in contact with the inner wall of the case.

In order to transfer the rows of the disks D from the delivery case 116 to the in-process case 117, the disks D are taken out of the delivery case 116 together with the holder 105 to be transferred into the in-process case 117 as it is, and with the disks D being left in the in-process case 117, the holder 105 is contracted in diameter to withdraw the holder 105 from inside the axle hole of each of the disks D. This allows each of the disks D to be transferred into the in-process case 117.

According to embodiment 1 of the present invention as described above, since the disks are accommodated in a delivery case with the inner peripheries of the axle holes of the disks supported when the disks are transported or stored, the outer circumference portions of the disks are prevented from being damaged by being brought into contact with the inner wall of the case, thus never reducing the recording surface of the disks.

In particular, when embodiment 1 of the present invention is implemented, the disks are received into the flues between the rows of the guides, held by three-point support provided by the supports forming the projected rows, and all the more, one of the supports is provided with resiliency to be acted upon the inner periphery of the axle hole of the disk, thereby supporting the disk in a stable state without excessive force being applied thereto.

Embodiment 1 of the present invention as described above makes it possible to put disks into and take the disks out of a delivery case, and put the disks into and take the disks out of an in-process case by means of a robot, thus implementing the automatic management of transportation and storage of storage disks that require careful handling.

Embodiment 2

Next, embodiment 2 of the present invention will be explained with reference to the drawings. Referring to FIG. 8, for example, the disk holder 205 (hereinafter referred to as a holder) according to embodiment 2 of the present invention is inserted into axle holes D1 of magnet disks (hereinafter referred to as disks) D, D . . . , which are mounted on hard disks to be used as external storage units of a computer, in order to support a plurality of disks at intervals from each other in juxtaposition, comprising an assembly of a first core 201 and a second core 202.

Referring to FIGS. 9 and 10, the first and second cores 201 and 202 and a cam actuator 210 of FIG. 8 can be made of synthetic resin, which is normally used for the formation of synthetic resin by means of injection molding, such as polypropylene, polyethylene terephthalate, acrylonitrile butadiene styrene copolymer, polyphenylene oxide, and polycarbonate, and should only have a level of rigidity such that when holding the disks, the molds are not deformed due to deflection caused by the weight of the disks to prevent the adjacent disks from being brought into contact with each other.

In addition, in order to prevent damage to the disks caused by the occurrence of static electricity, adhesion of dust particles or the like, the synthetic resin material may be formed by blending in advance with an anti-static material such as carbon powder, metallic powder, conductive fabrics, or an anti-static agent to prevent static electricity from developing on the cores 201, 202, and the like.

Alternatively, as countermeasures against the prevention of occurrence of static electricity, the surface of a mold, after molded, may be provided with a conductive polymer layer such as of poly-pyrrole. At this time, the surface resistivity may be preferably $10^{12} \Omega/\square$ or less for prevention of electrification.

Each of the cores has leg portions (the leg portions of the first core are referred to as 203a to be distinguished from the leg portions of the second core denoted as 203b), a curved surface portion for connecting between the legs (the curved surface portion of the first core is referred to as 204a to be distinguished from the curved surface portion of the second core denoted as 204b), and is a bar member having a constant length (a length that is received in an in-process case or a delivery case, for accommodating a plurality of disks D) and a generally U-shaped cross section.

Figure 11:
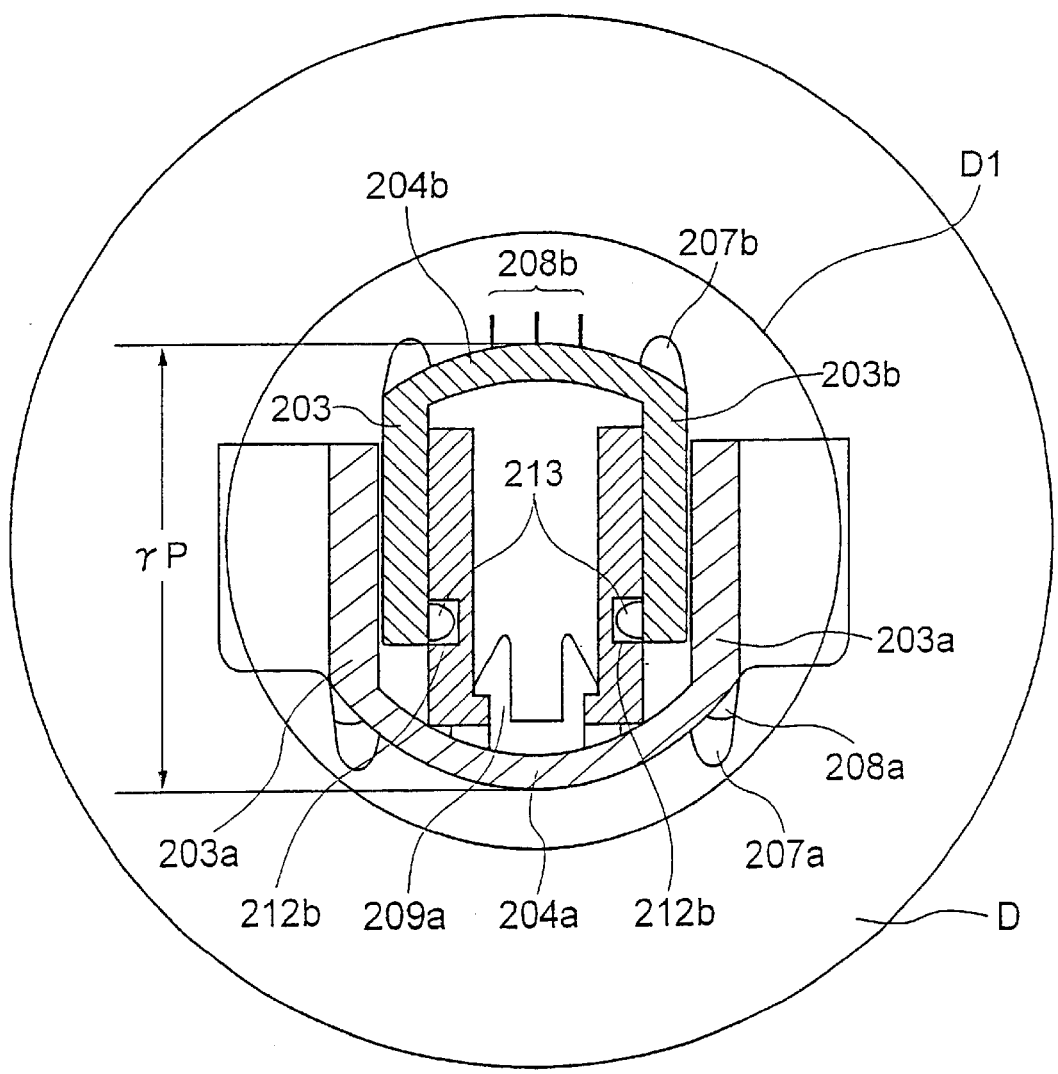
FIG. 11 is an enlarged cross-sectional view showing a portion corresponding to line 11—11 of FIG. 8(a), showing the contracted diameter position of a holder.

The leg portions are formed in a pair. The width between the leg portions 203a and 203a of the first core 201 is greater than that between leg portions 203b and 203b of the second core. As shown in FIG. 11, the leg portions 203b and 203b of the second core are allowed to fit within the leg portions 203a and 203a of the first core 201, facing each other, such that the combination allows the contraction and expansion of the spacing between the curved surface portions 204a and 204b to be adjusted.

Figure 12:
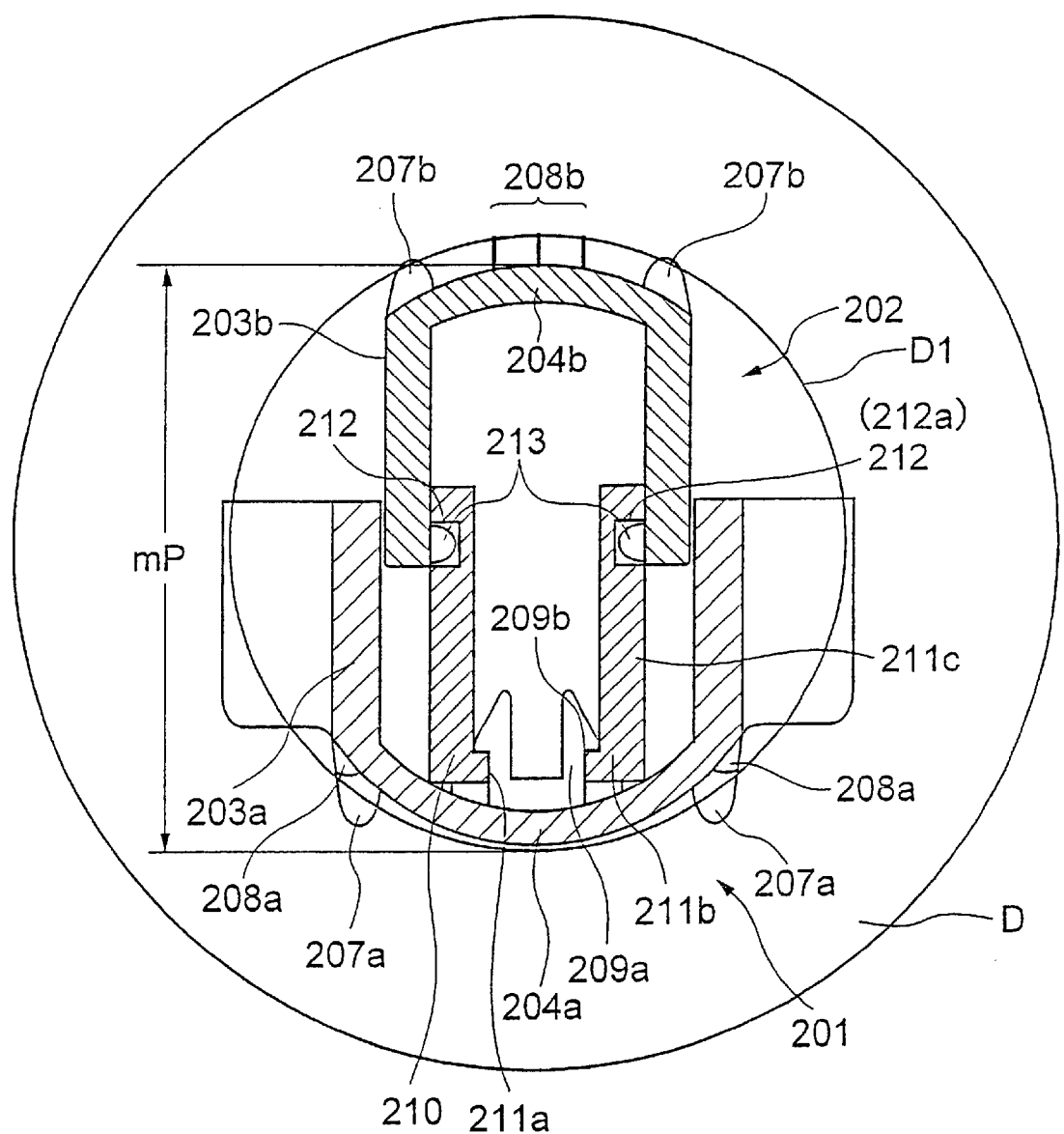
FIG. 12 is an enlarged cross-sectional view showing a portion similar to FIG. 11, showing the expanded diameter position of a holder.

That is, the first core 201 and the second core 202 are allowed to face each other and are combined with each other such that the cores can be expanded and contracted within the range between the contracted diameter position rP shown in FIG. 11 and the expanded diameter position mP shown in FIG. 12.

In embodiment 2 of the present invention, the expanded diameter position mP is the position at which the inner periphery of the axle hole of the disk D is supported, while the contracted diameter position rP is the position at which a holder 205 comprising the pair of the cores 201 and 202 is withdrawn from or inserted into the axle hole D1 of the disk D.

Referring to FIG. 12, the curved surface portions 204a and 204b of the cores 201 and 202, combined with each other, are formed in the shape of arcs having the same radius so as to sit on the same circumference at the expanded diameter position mP.

Moreover, the first and second cores 201 and 202 have, on the external surface thereof, rows of guides (the first guides are referred to as 207a to be distinguished from the second guides denoted as 207b) and supports (the supports of the first core are referred to as 208a to be distinguished from the supports of the second core denoted as 208b).

The rows of guides are to form flutes 206a or 206b inbetween the guides, for holding a plurality of disks D at predetermined intervals as shown in FIG. 8 (refer to FIGS. 9 and 10). In this embodiment, the rows of the guides 207a of the first core 201 are formed at the same positions of both ends of the curved surface portion 204a. Likewise, the rows of the guides 207b of the second core 202 are formed at the same positions of both ends of the curved surface portion 204b.

The supports are projected rims for supporting the inner periphery of the axle hole of the disk D. In this embodiment, the rows of the guides 207a of the first core 201 and the supports 208a are formed at the same positions of the both ends of the curved surface portion 204a. Therefore, the supports 208a are to be formed in the flutes 206a of the rows of the guides 207a.

In addition, supports 208b of the second core 202 are thin ribs that are formed in the central region of the curved surface portion 204b between the rows of guides 207b and 207b of the second core 202. Hereafter, the supports 208a of the first core 201 are referred to as "rigid supports" and the supports 208b of the second core 202 are referred to as "elastic supports" in order to distinguish from each other. The distinction between the rigidity and elasticity is particularly caused by a difference in thickness or shape.

Forming the support into the shape of a thin rib develops the resiliency and deflectivity that the material of the core has, whereas forming the support into the shape of a thick rib causes the support to have substantial rigidity. In this embodiment, the supports 208b are formed in three rows of ribs in parallel to each other as elastic supports. Each of the ribs makes use of the resiliency that the material of the core has, having the deflectivity, being deformed subjected to the weight of the disks D supported inbetween the rows of the respective guides, acting the repulsive force due to the elasticity that it owns on the inner periphery of the axle hole of the disks D, and sustaining the shape of each of the disks to a certain attitude. In contrast, the rigid supports 208a only receive the disk by point contact with the inner periphery of the axle hole of the disk D.

Figure 13:
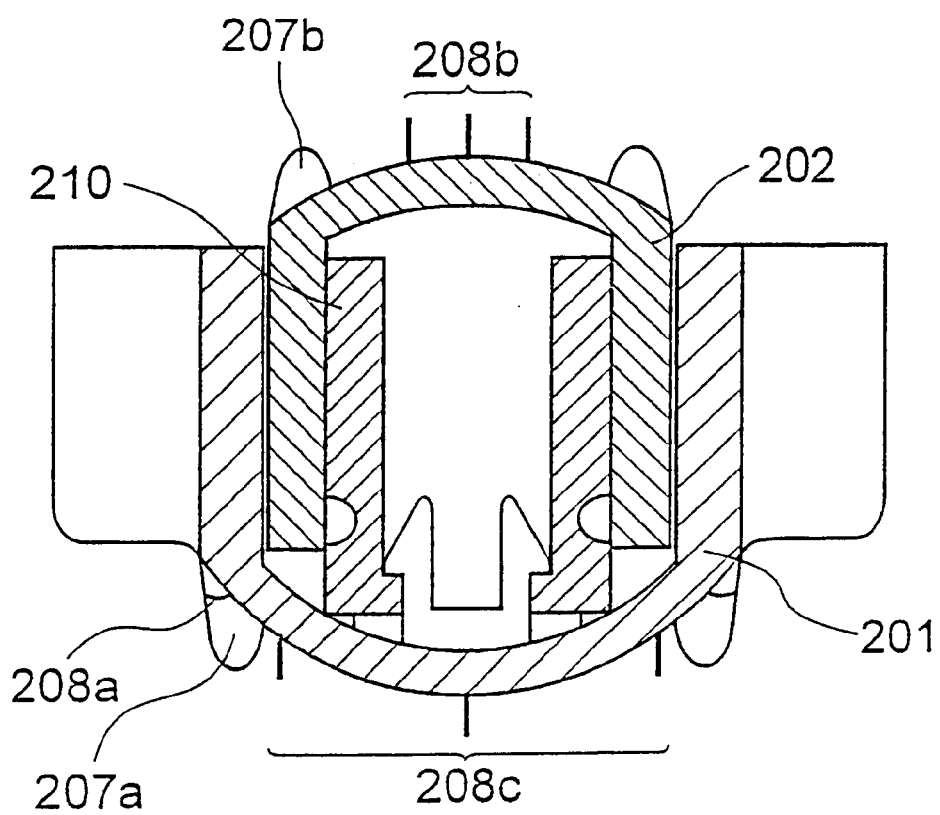
FIG. 13 is an enlarged cross-sectional view showing a portion similar to FIG. 11, a showing another modified embodiment of embodiment 2 of the present invention.

In this embodiment, the elastic supports 208b are selected to sit on the central region of the curved surface portion of the second core 202. However, as shown in FIG. 13, the ribs as elastic supports 208c can be provided on the central region of the curved surface portion of the first core 201. In this example, disks are supported by the elastic supports 208b and 208c that have deflectivity provided by the fixing supports 208a and 208a and ribs.

In FIG. 8, the first core 201 and the second core 202 have the cam actuator 210 inserted in the opening on the both ends thereof. The cam actuator 210 is to switch the combination of the first core 201 and the second core 202 between the expanded diameter position mP and the contracted diameter position rP.

In FIGS. 11 and 12, a holding pestle 209a is provided in a projected manner on the center of the inner surface of the curved surface portion of the first core 201. The holding pestle 209a engages a guide groove 211a of the cam actuator 210 to allow the cam actuator 210 to be coupled to the first core 201 slidably, comprising a neck 209b. The neck 209b serves to retain the cam actuator 210 in the guide groove 211a and thus prevents the cam actuator 210 from dropping off the first core 201.

In FIGS. 8(b) and (c), the cam actuator 210 has a bottom portion 211b, rising portions 211c on the both sides thereof, the guide groove 211a for fitting said holding pestle 209a opened on the bottom portion 211b, a cam groove 212 for the operation of expansion and contraction formed on the rising portions 211c on the both sides.

As shown in FIG. 8(b), the cam groove 212 comprises horizontal portions 212a and 212b on the upper and lower portions, which provide the expanded diameter position mP and the contracted diameter position rP, and an inclined portion 212c that connects both the horizontal portions 212a and 212b. As shown in FIGS. 11 and 12, in the cam grooves 212, cam pins 213 engage which are projected inwardly from both the leg portions 203b of the second core 202.

In this embodiment, the holder 205 comes to the expanded diameter position mP as shown in FIG. 12 where the cam actuator 210 is pushed most deeply into the holder 205 and the cam pins 213 are positioned at the upper horizontal portions 212a of the cam grooves 212. On the contrary, the holder 205 comes to the contracted diameter position rP where the cam actuator 210 is withdrawn outwardly out of the holder 205 as shown in FIG. 11 where the cam pins 213 are positioned at the lower horizontal portions 212b of the cam grooves 212.

In embodiment 2 of the present invention, the cam actuator 210 is withdrawn out of the holder 205 with the holder 205 kept at the contracted diameter position rP and inserted into the axle hole D1 of the disk D. Then, a plurality of storage disks D, D . . . are inserted onto the holder 205 and then the cam actuator 210 is pushed from the both ends of the holder 205 therein.

This allows the holder 205 to be expanded and retained in the place, and the disks D, D . . . each are guided bathe rows of the guides 207a and 207b formed on the respective cores to be received inbetween the guides, supported by the rigid supports 208a and 208a and the elastic supports 208b (208c), and subjected to the repulsive force due to the deflected deformation of the ribs caused by the elastic supports 208b (208c), and the disks D are supported in place in the predetermined attitude resisting the elasticity that the cores have.

Referring to FIG. 14, an in-process case 217 employs a container with flutes provided for holding disks on the inner wall, while a delivery case 216 employs a hollow container without the holding flutes on the inner wall.

When a plurality of disks D, D . . . are delivered, rows of disks D are held on the holder 205 and the holder 205 is suspended with the both ends thereof supported by the delivery case 216 to accommodate the rows of the disks D in the case. Thus, the case is stored or transported without the peripheral portion of the disks in contact with the inner wall of the case.

In order to transfer the rows of the disks D from the delivery case 216 to the in-process case 217, the disks D are taken out of the delivery case 216 together with the holder 205 to be transferred into the in-process case 217 as it is, and with the disks D being left in the in-process case 217, the holder 205 is contracted in diameter to withdraw the holder 205 from inside the axle hole D1 of each of the disks D. This allows each of the disks D to be transferred into the in-process case 217.

According to embodiment 2 of the present invention, when disks are held on the holder or conversely when the disks are removed from the holder 205, the cam actuator 210 is slid in and out, which is inserted in the both ends of the holder 205. However, even when the sliding of the cam actuator 210 accompanies the occurrence of dust particles due to the friction between the cam actuator 210 and the first core 201 or between the first and second cores 201 and 202, the pumping action of the sliding of the cam actuator 210 would not cause dust particles to issue from the holder since no open portion exists on the surface of the first core 201 and second core 202. Accordingly, the disks D will never be contaminated by dust particles.

According to embodiment 2 of the present invention as described above, even when sliding the cam actuator in and out, which is inserted in the opening on the both ends of the holder, causes the portions rubbed against each other to wear and produce fine particles or dust particles, the particles are retained inside the holder without letting the particles out. Accordingly, when disks are allowed into a manufacturing process or when disks are held on the holder or removed from the holder at the time of delivery, the disks would not be contaminated with dust particles but can always be kept clean.

Furthermore, according to embodiment 2 of the present invention, ribs comprising thin projected rows are provided on part of the outer surface of the core. The repulsive force caused by deformation due to the deflection of the ribs thereby acts on the inner periphery of the axle hole of the disk. This force allows each of the disks to be held to the predetermined attitude perpendicular to the axle center of the holder. Therefore, disks adjacent to each other can be prevented from being brought into contact with each other and thus can be held in a stable state on the holder.

Embodiment 3

Figure 15A:
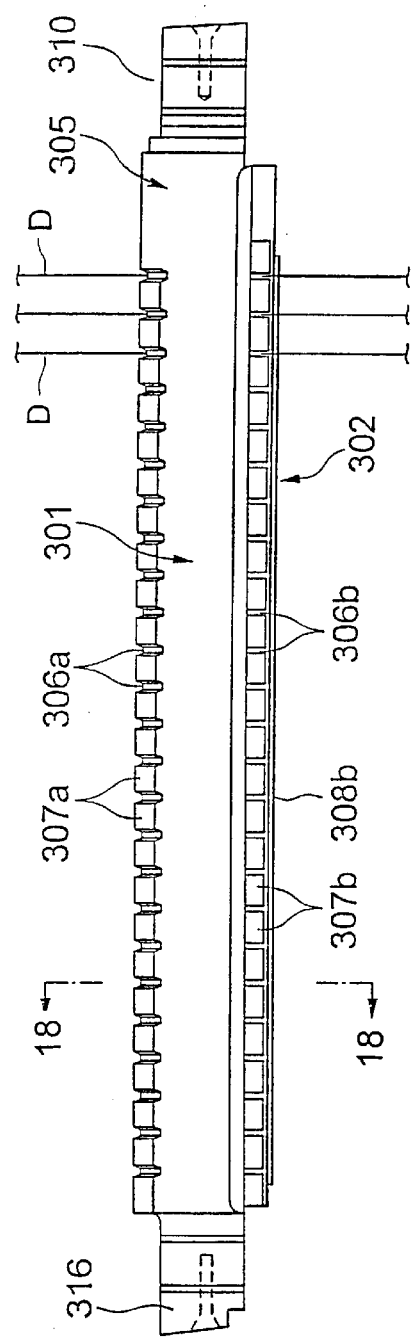
FIG. 15(a) is a view of a disk holder showing disks held on a holder relating to embodiment 3 of the present invention.

Next, embodiment 3 of the present invention will be explained with reference to the drawings. Referring to FIG. 15, for example, the disk holder (hereinafter referred to as a holder) according to embodiment 3 of the present invention is inserted into axle holes of magnet disks (hereinafter referred to as disks) D, D . . . , which are mounted on hard disks to be used as external storage units of a computer, in order to support a plurality of disks at intervals from each other in juxtaposition, comprising an assembly of a first core 301, a second core 302, and a cam actuator 310.

The first and second cores 301 and 302 and a cam actuator 310 can be made of synthetic resin, which is normally used for the formation of synthetic resin by means of injection molding, such as polypropylene, polyethylene terephthalate, acrylonitrile butadiene styrene copolymer, polyphenylene oxide, and polycarbonate, and should only have a level of rigidity such that when holding the disks, the molds are not deformed due to deflection caused by the weight of the disks so as to prevent the adjacent disks from being brought into contact with each other.

In addition, in order to prevent damage to the disks caused by the occurrence of static electricity, adhesion of dust particles or the like, the synthetic resin material may be formed by blending in advance with an anti-static material such as carbon powder, metallic powder, conductive fabrics, or an anti-static agent to prevent static electricity from developing on the cores 301, 302, and the like.

Alternatively, as countermeasures against the prevention of occurrence of static electricity, the surface of a mold, after molded, may be provided with a conductive polymer layer such as of poly-pyrrole. At this time, the surface resistivity may be preferably $10^{12} \Omega/\square$ or less for prevention of electrification.

Referring to FIGS. 16 and 17, each of the cores 301 and 302 has leg portions (the leg portions of the first core are referred to as 303a to be distinguished from the leg portions of the second core denoted as 303b), a curved surface portion for connecting between the legs (the curved surface portion of the first core is referred to as 304a to be distinguished from the curved surface portion of the second core denoted as 304b), and is a bar member having a constant length (a length that is received in an in-process case or a delivery case, for accommodating a plurality of disks) and a generally U-shaped cross section.

Figure 18:
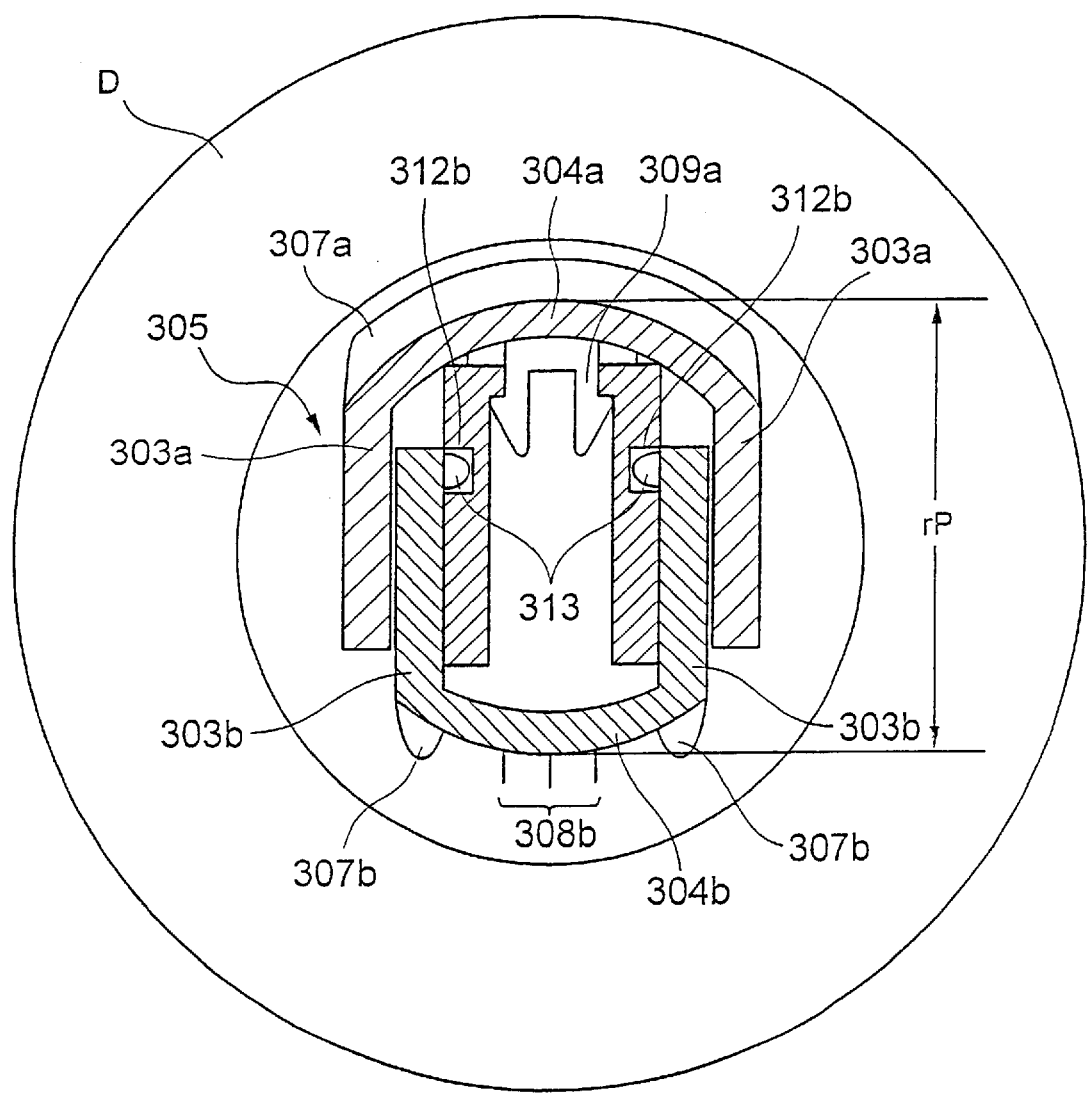
FIG. 18 is an enlarged cross-sectional view showing a portion corresponding to line 18—18 of FIG. 15(a), showing the contracted diameter position of a holder.

The leg portions are formed in a pair. The width between the leg portions 303a and 303a of the first core 301 is greater than that between leg portions 303b and 303b of the second core. As shown in FIG. 18, the leg portions 303b and 303b of the second core are allowed to fit in the leg portions 303a and 303a of the first core 301, facing each other, combined with each other such that the contraction and expansion of the spacing between the curved surface portions 304a and 304b can be adjusted by the relative displacement of the leg portions 303a and 303b.

Figure 19:
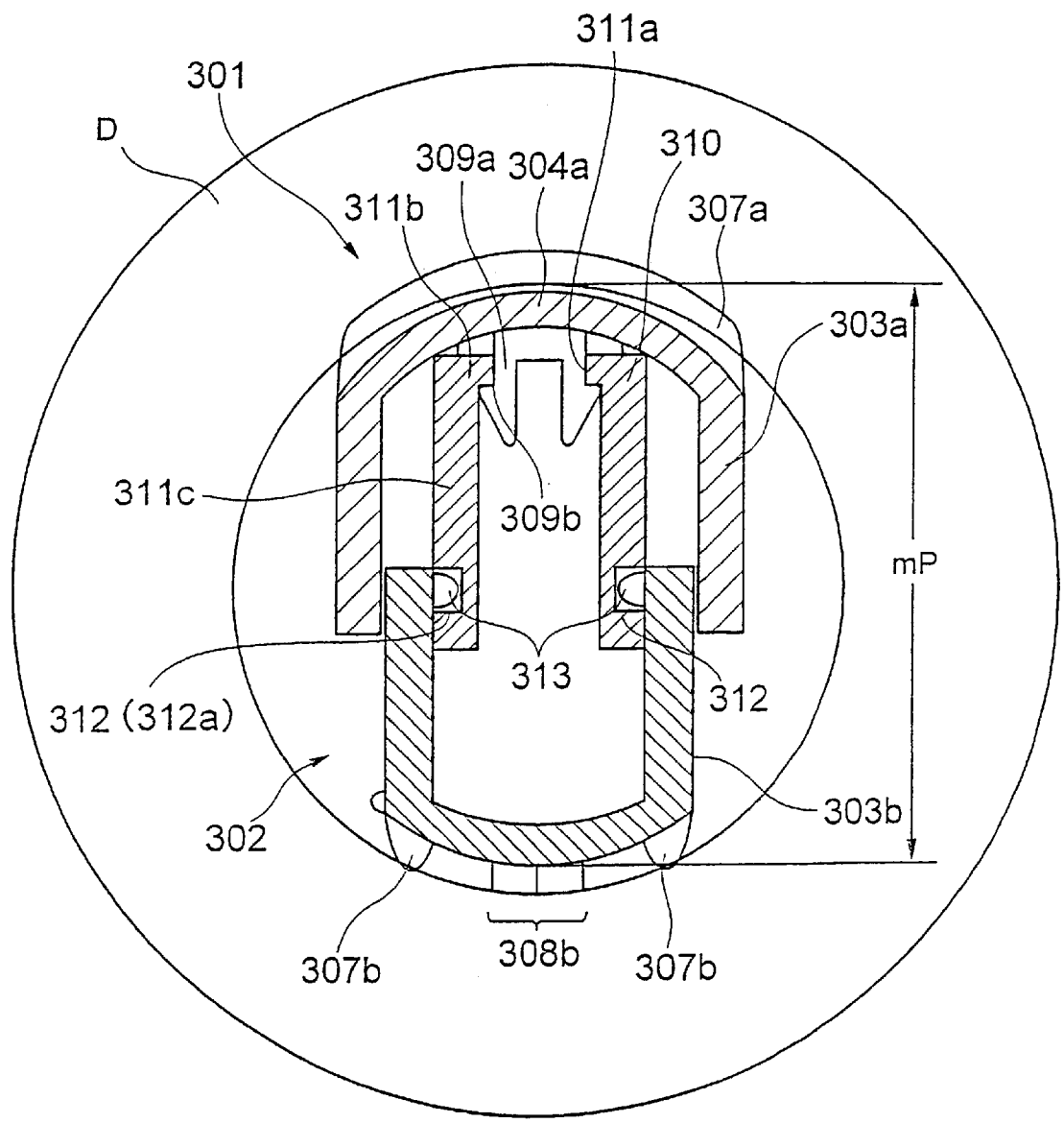
FIG. 19 is an enlarged cross-sectional view showing a portion similar to FIG. 18, showing the expanded diameter position of a holder.

That is, the first core 301 and the second core 302 are allowed to face each other and are combined with each other in the shape of a cylinder such that the cores can be expanded and contracted within the range between the contracted diameter position rP shown in FIG. 18 and the expanded diameter position mP shown in FIG. 19. Furthermore, the distinction between the first core and the second core is drawn exclusively for convenience in explanation, and any one of them may be the first or the second core.

In embodiment 3 of the present invention, the expanded diameter position mP is the position at which the inner periphery of the axle hole of the disk D is supported, while the contracted diameter position rP is the position at which a holder is withdrawn from or inserted into the axle hole of the disk D.

Moreover, the first core 301 and the second core 302 have, on each of the external surfaces of the curved surface portions 304a and 304b, rows of guides (the first guides are referred to as 307a to be distinguished from the second guides denoted as 307b).

The rows of guides are to form flutes 306a or 306b inbetween the guides, for holding a plurality of disks D at predetermined intervals as shown in FIG. 15 (refer to FIGS. 16(e) and 17(d)). In this embodiment, the rows of the guides 307a of the first core 301 are formed in the shape of an arc on the circumference of the curved surface portion 304a. On the other hand, the rows of the guides 307b of the second core 302 are formed at the both ends of the curved surface portion 304b.

In addition, the second core 302 has supports 308b. The supports 308b are to support the inner periphery of the axle hole of the disk D, having elasticity. In this embodiment, the supports 308b are thin ribs formed on the curved surface portion 304b between the rows of the guides 307a and 307b of the second core 302.

Forming the support 308b into the shape of a thin rib develops the resiliency and deflectivity that the material of the core has, whereas forming the support into the shape of a thick rib causes the support to have substantial rigidity. In this embodiment, the supports 308b are formed in three rows of ribs in parallel to each other as elastic supports. Each of the ribs is deformed subjected to the weight of the disks D supported inbetween the rows of the respective guides, acting the repulsive force due to the elasticity that it owns on the inner peripheries of the axle holes of the disks D, and sustaining the shape of each of the disks to a certain attitude.

In FIGS. 16 and 18, a plurality of holding pestles 309a are provided in a projected manner on the inner surface of the curved surface portion of the first core 301 at certain intervals. The holding pestles 309a are distributed and provided at three positions of the center, right, and left of the first core 301, and engage a guide groove 311a, which is to be described later, of the cam actuator 310 to allow the cam actuator 310 to be coupled to the first core 301 slidably lengthwise. Each of the holding pestles 309a is provided with a neck 309b. The neck 309b serves to retain the cam actuator 310 in the guide groove 311a and thus prevents the cam actuator 310 from dropping off the first core 301.

In FIG. 15, the cam actuator 310 comprises a knob 310a and a shaft 310b. The shaft 310b is inserted into the opening of one end of the cylinder of the holder 305 having the combination of the first and second cores 301 and 302 and is held movably by said three holding pestles 309a. In addition, the shaft 310b supports the second core 302 at two points or more, keeping the first core and the second core parallel to each other and switching the cylinder of the holder 305 between the expanded diameter position mP and the contracted diameter position rP.

The shaft 310b is inserted into the cylinder of the holder 305 substantially along the entire length thereof and provided with at least two or more cam grooves 312 and guide grooves 311a within the stroke of the cam actuator 310.

Figure 15B:
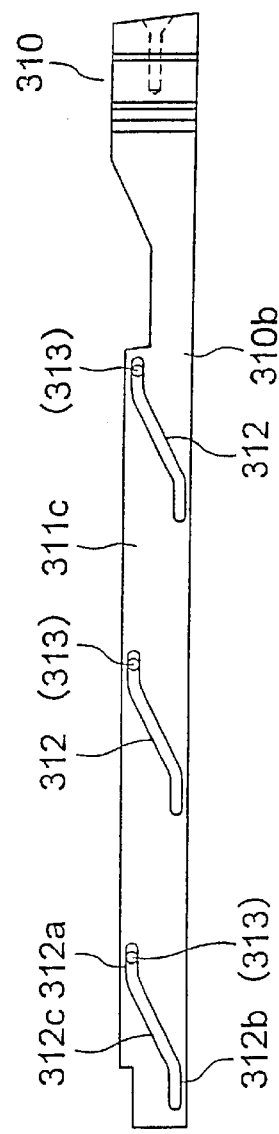
FIG. 15(b) is a side view showing a cam actuator.
Figure 15C:
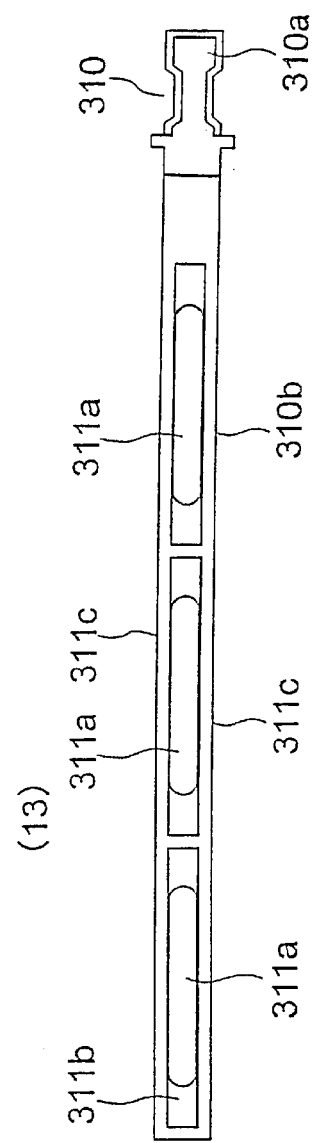
FIG. 15(c) is a plan view showing the cam actuator.

In FIGS. 15(b) and (c), the shaft 310b has a bottom portion 311b, rising portions 311c on the both sides thereof, and the guide groove 311a for fitting said three holding pestles 309a opened on the bottom portion 311b. In this embodiment, cam grooves 312 for the operation of expansion and contraction are formed at three positions on both rising portions 311c at given intervals.

Each of the cam grooves 312 comprises horizontal portions 312a and 312b on the upper and lower portions, which provide the cylinder of the holder 305 with the expanded diameter position mP and the contracted diameter position rP, and inclined portions 312c that connects to both the horizontal portions 312a and 312b. As shown in FIGS. 18 and 19, in each of the cam grooves 312, cam pins 313 engage which are projected inwardly from both the leg portions 303b of the second core 302.

Therefore, the cam actuator 310 is to be supported on the first core 301 by means of the three holding pestles 309a. On the other hand, the second core 302 is to be supported on the cam actuator 310 at three points on the center and on the right and left sides by means of the cam pins 313 engaging the cam grooves 312.

In this embodiment, the holder 305 comes to the expanded diameter position mP as shown in FIG. 19 where the cam actuator 310 is pushed most deeply into the cylinder of the holder 305 and each of the cam pins 313 is positioned at each of the upper horizontal portions 312a of the cam grooves 312. On the contrary, the holder 305 comes to the contracted diameter position rP where the cam actuator 310 is withdrawn outwardly out of the holder 305 as shown in FIG. 18 where the cam pins 313 are positioned at the lower horizontal portions 312b of the cam grooves 312.

In FIG. 15(a), there is provided a grip 316 corresponding to the knob 310a of the cam actuator 310 on the end portion of the cylinder of the holder 305, into which the cam actuator 310 is not inserted.

The grip 316 is integrated with an end surface of the first core 301 as shown in FIG. 16 and may have the same shape as the knob 310a. However, in order to provide the holder 305 with directivity with respect to the case when the holder 305 is accommodated in an in-process case or in a delivery case, the grip 316 and the knob 310a are made different in shape and the in-process case and the delivery case are provided with unique receiving portions suitable for the respective shapes of the knob 310a and grip 316. The holder can be thereby accommodated in the case.

In embodiment 3 of the present invention, the grip 316 on the one end of the holder 305 is held by hand and the knob 310a on the other end is pushed in to allow the cam actuator 310 to be withdrawn from the cylinder of the holder 305, so that the holder 305 comes to the contracted diameter position rP. The holder 305 is kept at the contracted diameter position rP and inserted into the axle hole D1 of the disk D. Then, a plurality of storage disks D, D . . . are inserted onto the holder 305 and then the cam actuator 310 is inserted into the holder 305.

This allows the holder 305 to be expanded and retained at the expanded diameter position mP. The disks D, D . . . each are guided by the rows of the guides 307a and 307b formed on the respective cores to be received inbetween the guides, supported by the elastic supports 308b, and subjected to a repulsive force due to the deflected deformation of the ribs caused by the elastic supports 308b. The disks D are supported in place in the predetermined attitude resisting the elasticity that the cores have.

In embodiment 3 of the present invention, the second core 302 is not deflected since at least two or more main portions thereof are supported by means of the cam actuator 310 via the cam pins. Accordingly, the disks D are supported uniformly along the entire length of the holder 305.

In addition, in embodiment 3 of the present invention, when the cam actuator 310 is manipulated at one side thereof to be pushed into the cylinder of the holder 305 with the grip 316 fixed or held in place or when the cam actuator 310 is drawn out of the cylinder of the holder 305 to be switched from the expanded diameter position mP to the contracted diameter position rP or conversely from the contracted diameter position rP to the expanded diameter position mP, the operation can be easily carried out by means of robot arms. Thus, the holder 305 can be smoothly expanded or contracted without difficulty while the first and second cores 301 and 302 are kept in parallel.

According to embodiment 3 of the present invention as described above, at least two or more main portions of the first and second cores supported at distributed positions by means of the cam actuator causes the cam actuator to serve as a so-called core member. Accordingly, this allows no deflection to develop on the central position of the cylinder, which is not supported in a prior art. Therefore, this enables holding of the disks uniformly along the entire length of the cylinder, thus providing increased stability in holding disks.

Furthermore, when the cylinder of the disk holder is switched from the contracted diameter position rP to the expanded diameter position mP or from the expanded diameter position mP to the contracted diameter position rP, the grip on the one end of the cylinder is fixed and the cam actuator on the other end is manipulated to be pushed into the cylinder or drawn out of the cylinder, that is, the switching between the expansion and the contraction of the cylinder can be carried out by manipulating only one side thereof. Therefore, no problem is raised in the case where the robot is employed to expand or contract the cylinder of holder. In addition, the expansion and the contraction can be performed smoothly without difficulty by pushing up or pulling down the second core simultaneously by means of the cam pins at portions of at least two or more main portions in the cylinder of holder, with the first and second cores kept in parallel to each other.

Embodiment 4

Figure 20:
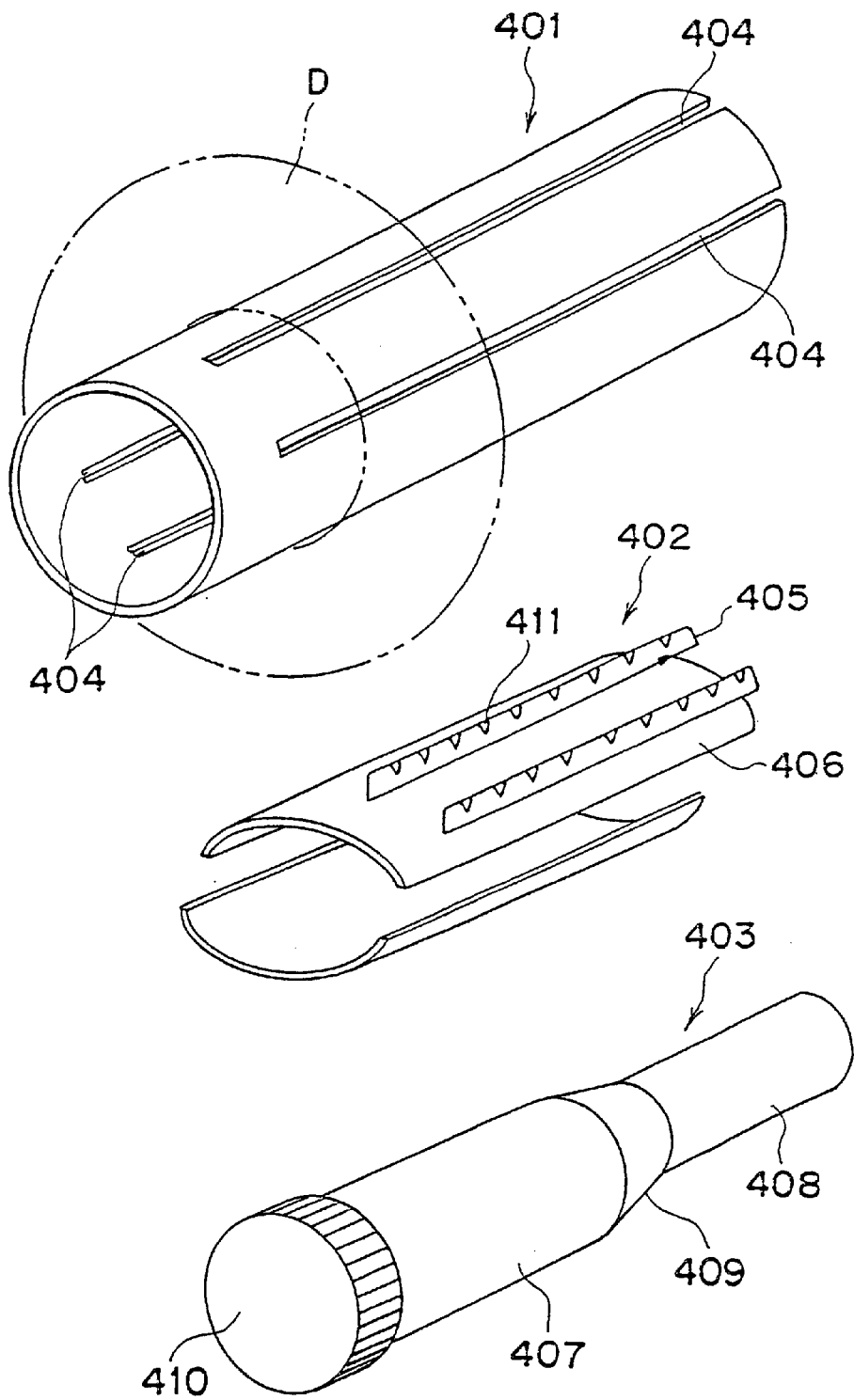
FIG. 20 is an exploded perspective view of a disk holder showing embodiment 4 of the present invention.
Figure 21A:
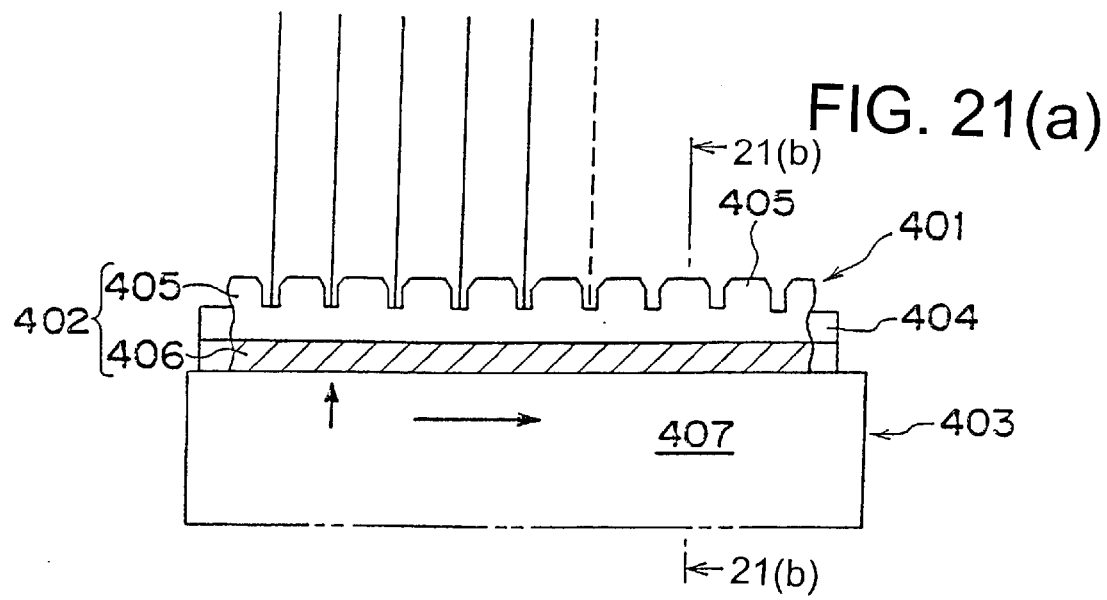
FIG. 21(a) is a partial longitudinal sectional view showing disks held and FIG. 21(b) is a cross-sectional view taken along line 21(b)—21(b) of FIG. 21(a).
Figure 21B:
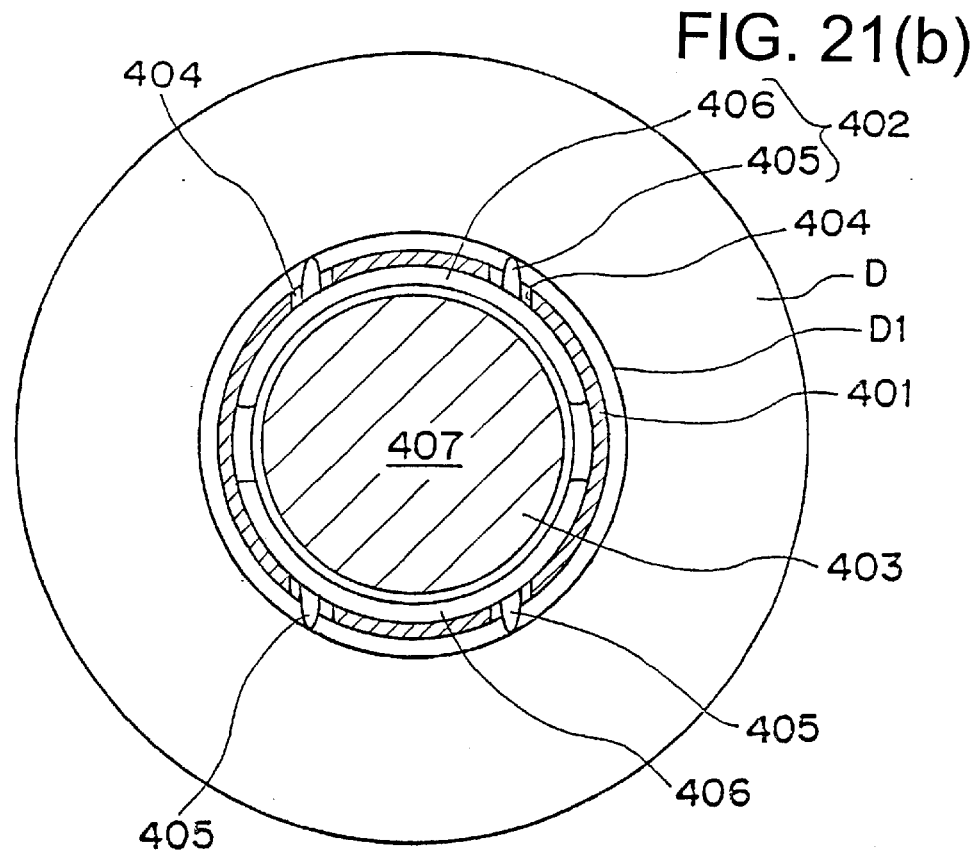
Figure 22A:
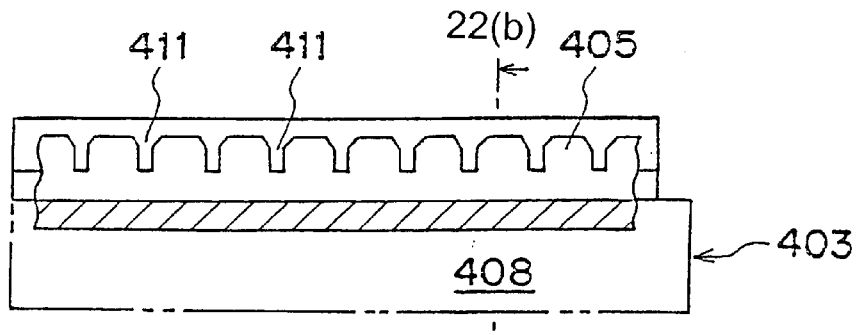
FIG. 22(a) is a partially sectional, longitudinal sectional view showing disks with their support released
Figure 22B:
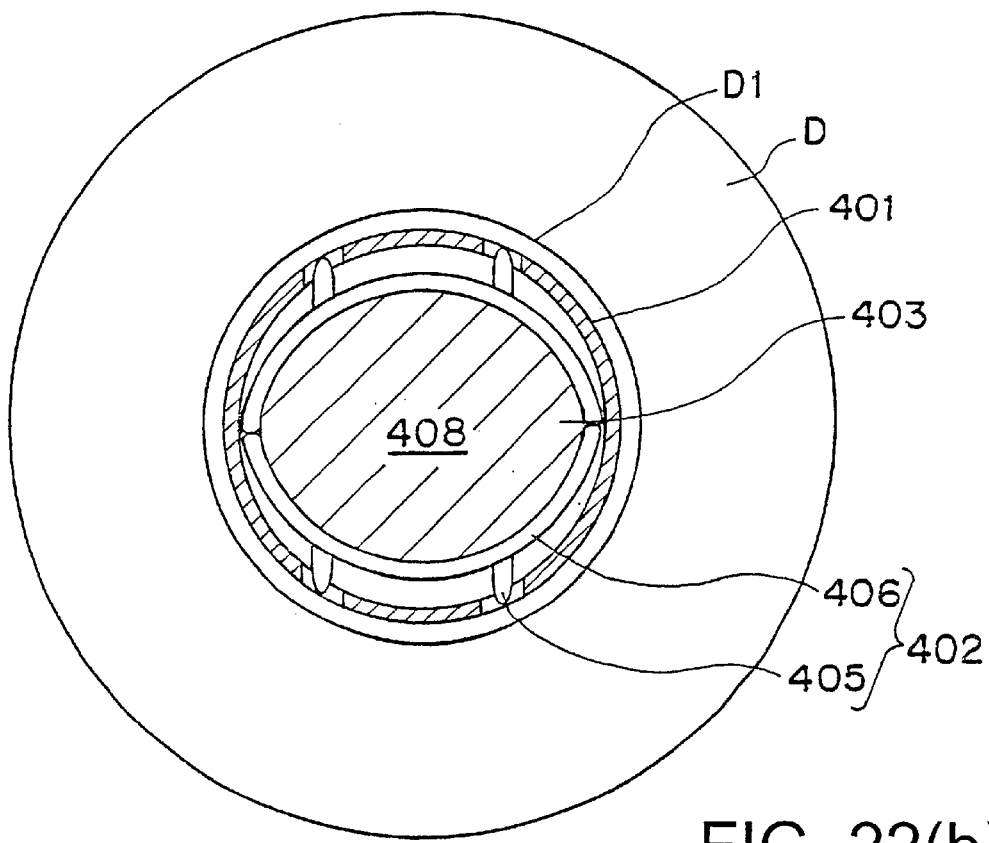
FIG. 22(b) is a cross-sectional view taken along line 22(b)—22(b) of FIG. 22(a).

Next, embodiment 4 of the present invention will be explained with reference to the drawings. Referring to FIGS. 20 to 22, for example, the disk holder (hereinafter referred to as a holder) according to embodiment 4 of the present invention is inserted into axle holes of magnet disks (hereinafter referred to as disks) D, D . . . , which are mounted on hard disks to be used as external storage units of a computer, in order to support a plurality of disks at intervals from each other in juxtaposition, comprising an assembly of a core 401, a supports 402, and a cam actuator 403.

The core 401 is a holder portion to be inserted into the axle holes D1 across two or more disks D, D . . . , more specifically, the core 401 is smaller in diameter than that of the axle hole D1 of the disk so that the core can be inserted into and extracted from the axle hole D1 of the disk. The core 401 has generally the shape of a cylinder, a curved space portion inside the core, and slits 404 in the axial direction. The slits 404 are long holes to allow projected rows 405 to be projected which form part of supports 402. Two rows or more of the slits 404 are opened on the circumference of the core 401. In this embodiment, there are provided four rows of the slits 404 in total with two rows on the upper circumference portion and other two rows on the lower circumference portion.

The support 402 has projected rows 405 and a resilient portion 406. The projected rows 405 are the portion for supporting the inner periphery of the axle hole of the disk D by being projected from the inside to the outside through the slits 404 of the core 401. The projected rows 405 are projected in the shape of a rib on the convex surface of the curved surface of the resilient portion 406 and are formed in one piece therewith in the longitudinal direction thereof.

The resilient portion 406 is an elastic strip-shaped member with an arc-shaped curved surface in the cross section. The curved surface is set in radius to a value larger than the inner radius of the axle hole of the core 401 and therefore has a curved surface gentler in radius than the axle hole of the core 401, provided with a self-restoring property. The resilient portions 406 are inserted into the axle hole of the core 401 in a pair and are supported by means of the cam actuator 403 on the concave surface thereof.

The cam actuator 403 is inserted into the axle hole of the core 401 to deform forcefully the curved surface of the resilient portions 406 against the curved surface of the axle hole of the core 401.

On the contrary, the forced deformation of the resilient portion 406 is released by pulling the cam actuator 403 out of the axle hole of the core 401.

On the other hand, the forceful deformation of the curved surface of the resilient portion 406 against the inner diameter of the axle hole of the core causes the projected rows 405 to be pushed up to the convex surface of the resilient portion 406 to be protruded out of the core 401. On the contrary, when the forceful deformation of the resilient portion 406 is released, the resilient portion 406 will return to the original gentle curved surface and the projected rows 405 are pulled backward to retreat into the core 401.

In this embodiment, the cam actuator 403 comprises a relatively large-diameter protruded extruding manipulation portion 407 and a small-diameter protruded retracting manipulation portion 408, which are formed in a given range of the axle. The both portions are coupled to each other via a tapered portion or a guide portion 409 disposed from the protruded retracting manipulation portion 408 to the protruded extruding manipulation portion 407.

In order to release the forced deformation of the resilient portion 406, at least part of the deformation of the resilient portion 406 that has been forcibly deformed may be reasonably released to allow the projected rows 405 to be retracted into the core 401. However, even with the projected rows 405 retracted in the core 401, supporting the resilient portion 406 on the small-diameter protruded retracting manipulation portion 408 will allow part of the projected rows 405 to engage the inner wall of the slits 404 to be thus prevented from dropping off therefrom, and will prevent dislocation between the slits 404 and the projected rows 405. In this embodiment, the protruded retracting manipulation portion 408 is combined, in the cross-sectional shape thereof, with the gentle curved surface set beforehand to the resilient portion 406, facing each other, to be set to the shape of an ellipse.

In this embodiment, the curved surface of the inner diameter of the axle hole of the core 401 is a guide surface to contract the gentle curved surface of the resilient portion 406. In FIGS. 22(a) and (b), the resilient portion 406 is pressed by means of the large-diameter protruded extruding manipulation portion 407 of the cam actuator 403 inserted into the axle hole of the core 401 against the inner diameter of the axle hole of the core 401. The resilient portion 406 is pressed against the axle hole of the core 401 with the curved surface of the inner diameter of the axle hole of the core 401 serving as the guide surface so as to be forcibly deformed. Consequently, the resilient portion 406 becomes a curved surface of a smaller diameter against the curved surface of the axle hole of the core 401 to push up the projected rows 405 on the convex side to be protruded out of the core 401. The guide surface need not necessarily be the inner diameter of the axle hole of the cylindrical core.

In other words, the guide surface can take any surface so long as the guide surface can forcefully deform the gentle curved surface of the resilient portion 406 in order to push the projected rows 405 to outside the core 401 or the circumference thereof. In addition, the cam actuator 403 is to push the resilient portion 406 against the guide surface. Pushing the resilient portion 406 against the guide surface will cause the projected rows 405 to be supported by means of the cam actuator 403. With a cylinder used as the core, the cam actuator 403 is inserted into the core 401 from the opening of the cylinder and is to press the resilient portion 406 against the guide surface or the circumference surface of the axle hole of the core.

On the contrary, when the cam actuator 403 is pulled out of the core 401 to support the curved surface of the resilient portion 406 on the circumference surface of the small-diameter protruded retracting manipulation portion 408, the resilient portion 406 is released from the forced deformation and returns to the gentle curved surface, and the projected rows 405 are retreated into the core 401, as shown in FIGS. 22(a) and (b). When the cam actuator 403 is inserted into the axle hole only from the opening on one end of the core 401, the projected rows 405 can be supported by means of the protruded extruding manipulation portion 407 along the entire length of the core 401. In addition, when the cam actuator 403 is inserted from the opening on the both ends of the core 401 using a paired cam actuator, the axle ends of the both cam actuators are butted against each other in the core 401, and the small-diameter protruded retracting manipulation portion 408 provided on the distal end side of the cam actuator 403 and the resilient portion located on the outer circumference of the guide portion 409 or a taper become supportless.

In order to ease the above condition, such a configuration may be employed in which the protruded retracting manipulation portion 408 of the cam actuator 403 and the guide portion 409 are formed in the shape of an ellipse, the maximum diameter is made as in the protruded extruding manipulation portion 407. Moreover, for supporting the disks, the portion of the maximum diameter may be adapted to be in contact with the center of the resilient portion, whereas for releasing the support of the disks, the support may be adapted to be rotatable so that the portion of the maximum diameter is located at the both ends of the resilient portion by rotating the support.

Furthermore, when accommodated in the accommodating container of the disk holder, the outer ends of the cam actuator 403 are preferably made different from each other in the shape of the both ends so as to be supported at the both ends thereof and fixable, and allow the disk holder to have directivity. In addition, for such a cam actuator that is inserted into the axle hole only from the opening of one end of the core 401, such a support-shaped configuration may be employed that is fixed to the other end of the core.

The projected rows 405 are provided, along the longitudinal direction thereof, with fine notch 411 at regular intervals. Each of the notch 411 receives part of the inner circumference rim of each of the disks D, D . . . which are inserted onto the core 401 to enable preventing the adjacent disks from being brought into contact with each other and holding the disks at regular intervals.

In embodiment 4 of the present invention, the core and the cam actuator can be made of synthetic resin, which is normally used for the formation of synthetic resin by means of injection molding, such as polypropylene, polyethylene terephthalate, acrylonitrile butadiene styrene copolymer, polyphenylene oxide, and polycarbonate, and should only have a level of rigidity such that when holding the disks, the molds are not deformed due to deflection caused by the weight of the disks to prevent the adjacent disks from being brought into contact with each other. The supports are made of polyethylene, polypropylene, or the like which has elasticity and a self-restoring property, or thermoplastic elastomer such as styrene-based, olefin-based, urethane-based, polyester-based, or nylon-based elastomer.

In addition, in order to prevent damage to the disks caused by the occurrence of static electricity, adhesion of dust particles or the like, the synthetic resin material may be formed by blending in advance with an anti-static material such as carbon powder, metallic powder, conductive fabrics, or an anti-static agent to prevent static electricity from developing on the cores, and the like. Alternatively, as countermeasures against the prevention of occurrence of static electricity, the surface of a mold, after molded, may be provided with a conductive polymer layer such as of polypyrrole. At this time, the surface resistivity may be preferably $10^{12} \Omega/\square$ or less for prevention of electrification.

In embodiment 4 of the present invention, when knobs 410 protruding on the both ends of the core 401 are gripped and pulled outwards, the cam actuator 403 is drawn out of one end or both ends of the core 401, and the projected rows 405 of the supports 402 are retracted into the core 401. With the projected rows 405 retracted in the core 401, the core 401 is inserted into the axle hole D1 of the disk D and a plurality of storage disks D are inserted onto the circumference of the core 401 with the core 401 employed as the holder, and then the cam actuator 403 is inserted into the core 401.

As shown in FIG. 21, the projected rows 405 are pushed out of the slits 404 of the core 401. Each of the disks D is received by each of the notch 411 while being pressed by the projected rows 405, and the elasticity that the resilient portion 406 acts on the inner circumference of the axle hole of the disk D to allow the disks to be supported in place in parallel to each other in a predetermined attitude. When the core 401 is withdrawn from the each of the disks D, as shown in FIG. 22, pulling the cam actuator 403 out of the core 401 will allow the resilient portion 406 that supports the projected rows 405 to release a part of the forced deformation and the projected rows 405 to be pulled into the slits 404 of the core 401. However, so long as the concave surface of the curved surface of the resilient portion 406 is supported by means of the protruded retracting manipulation portion 408, the projected rows 405 will never drop off from the slits 404.

According to embodiment 4 of the present invention, such a configuration is employed in which a cylindrical core is used as the holder and the cam actuator is inserted into the core, thereby allowing the projected rows for supporting disks to be protruded from or retracted into the core surface. Accordingly, relatively small amount of force is required to allow the manipulation of support and release to be carried out. In particular, the projected rows are provided on the recessed surface of the resilient portion formed in the shape of an arc, having elasticity and a self-restoring property, and the curved surface of the arc of the resilient portion is set to a value greater in radius than the curved surface of the axle hole of the core. Accordingly, when the cam actuator is pushed into the core, the curved surface of the axle hole of the core serves as the guide surface to allow the curved surface of the resilient portion to be forcibly deformed along the curved surface of the axle hole of the core. Following this deformation, the projected rows can be pushed into the slits of the core to allow the elastic force of the resilient portion to act on the projected rows, thereby enabling supporting each core in a stable state. On the contrary, pulling the cam actuator out of the core causes the support of the resilient portion to be automatically released, the forced deformation to be partly released, the resilient portion to restore the shape of the original curved surface by the self-restoring property owned by itself, and the projected rows to be retracted into the slits. At this time, the resilient portion is supported on the protruded retracting manipulation portion of the cam actuator, thereby preventing the projected rows from dropping off the slits to make them available for supporting disks thereafter.

Embodiment 5

Figure 23A:
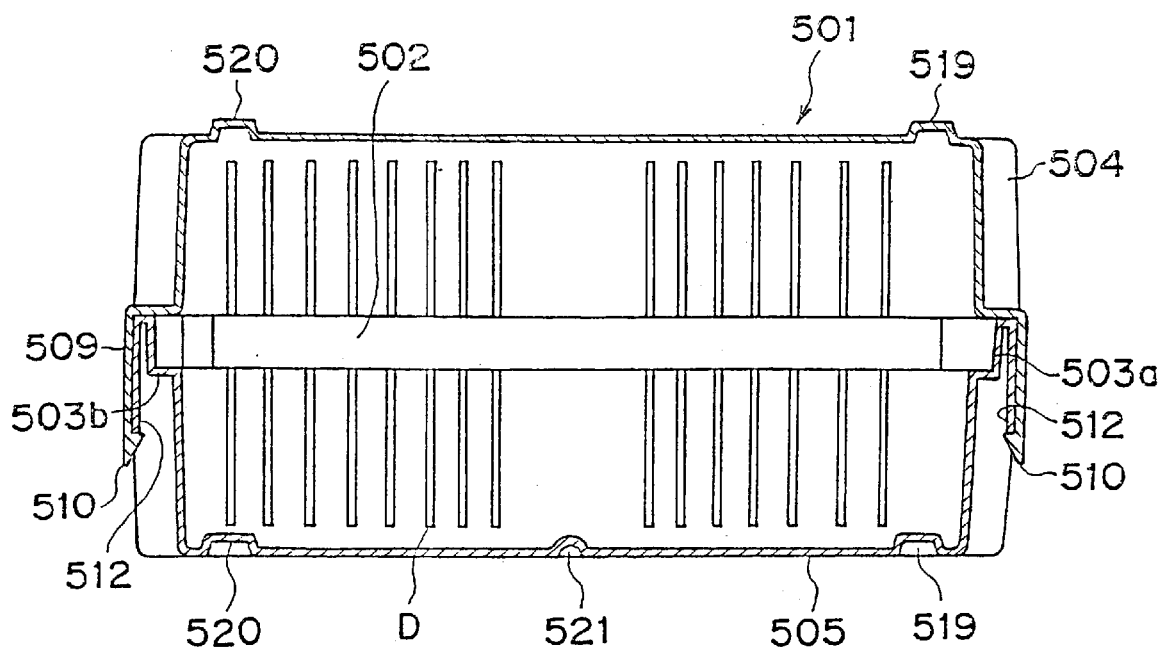
FIG. 23(a) is a cross-sectional front view showing embodiment 5 of the present invention and FIG. 23(b) is a partially cross-sectional side view.
Figure 23B:
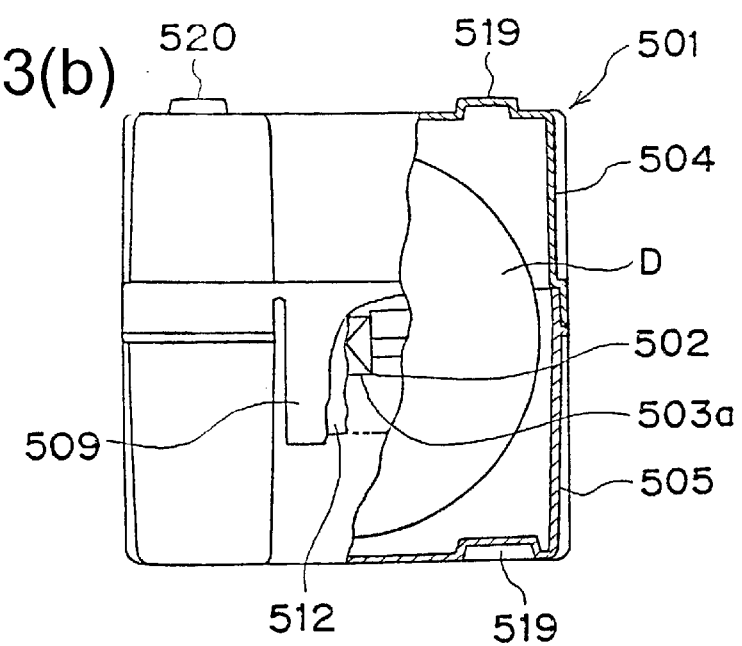

Next, embodiment 5 of the present invention will be explained with reference to the drawings. Referring to FIG. 23, a disk container according to embodiment 5 of the present invention comprises a combination of a box 501 and a holder 502.

The box 501 is a hollow rectangular parallelepiped container that has a hollow portion big enough to accommodate the disk D. The box 501 is provided, on the inner wall of the both ends in the longitudinal direction (the right and left ends of FIG. 23(*a*)), with bearing portions 503*a* and 503*b* for holding the holder 502.

In embodiment 5 of the present invention, the box 501 comprises a combination of an upper cover 504 and a lower cover 505. Each of the upper cover 504 and the lower cover 505 is a container with one surface opened. The upper cover 504 forms the upper surface of the box 501 and the lower cover 505 forms the lower surface of the box 501, which are coupled to each other detachably with the open rims facing to each other to form a sealed hollow container.

For the upper cover 504 and the lower cover 505, a synthetic resin material may be preferably selected that can be normally used, such as PP, PET, ABS, PPO, acrylic resin, in particular a transparent raw material so that the inside of the formed container can be viewed through from outside. In addition, as countermeasures against static electricity, the synthetic resin to be used as the raw material of the container may be desirably blended with carbon powder, metallic powder, conductive fabrics, or an anti-static agent, or a polymer alloy based persistent anti-static material may be desirably used.

Referring to FIG. 24, a part of the opposing opening rim of the lower cover 505 is provided integrally with a bracket 506 that juts out inwardly. In this embodiment, the bearing portions 503*a* and 503*b* are recesses provided to the bracket with the inner and upper portions of the lower cover 505 opened. On the bottom of the recesses, there is a projected piece 507 for positioning the holder 502, and, as shown in FIGS. 24(*d*) and (*e*), minute ribs 508 are formed, projected upwardly, on the both sides of the projected piece 507. The minute ribs 508 are to support the holder 502 by means of the elastic action with which the minute ribs 508 are provided.

Figure 24A:
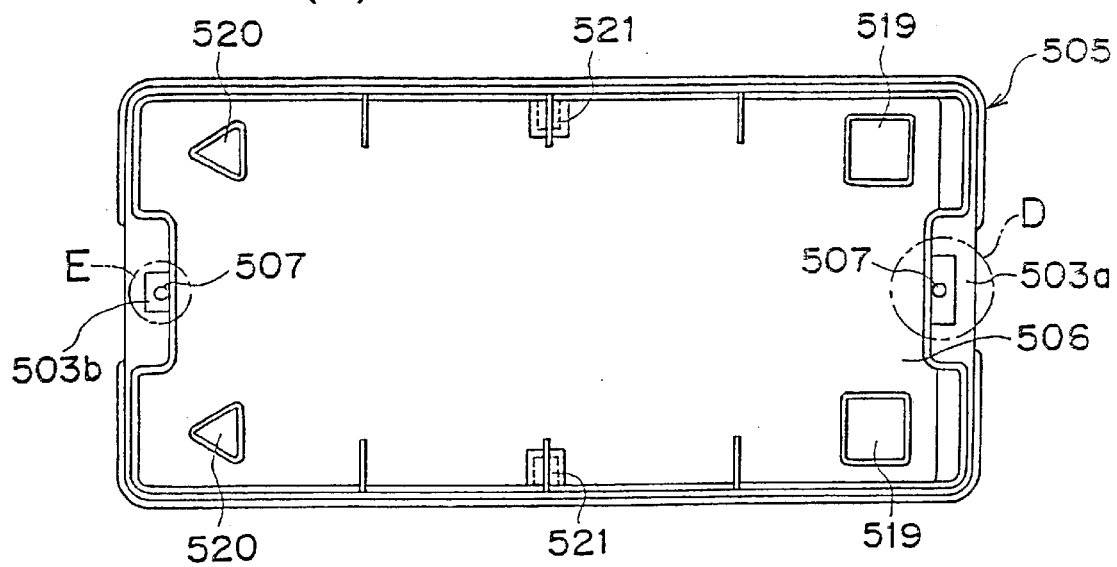
FIG. 24(a) is a plan view showing a lower cover.
Figure 24B:
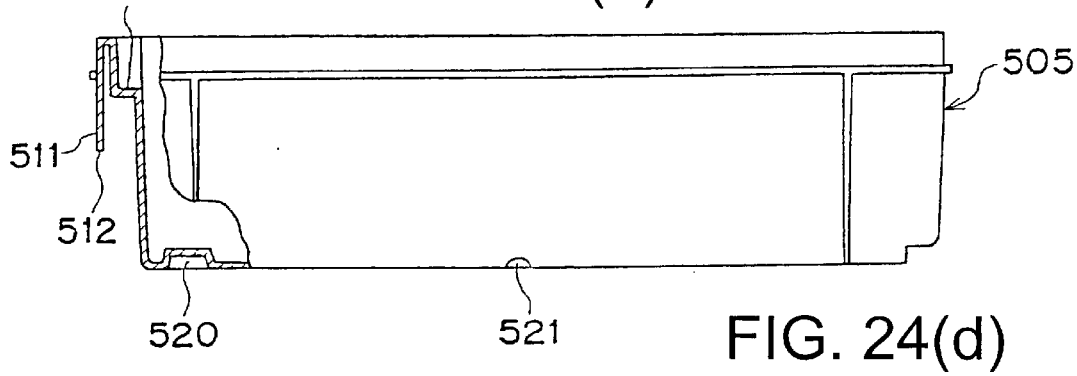
FIG. 24(b) is a partially cross-sectional front view.
Figure 24C:
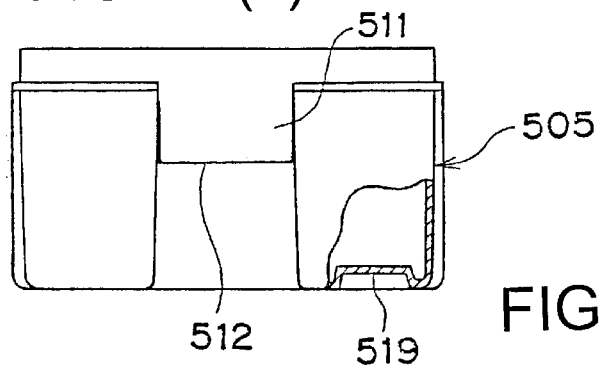
FIG. 24(c) is a partially cross-sectional side view.
Figure 24D:
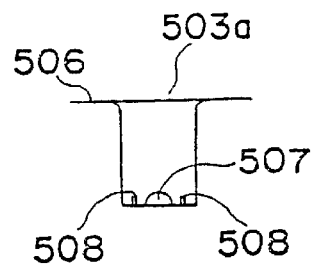
FIG. 24(d) is an enlarged view showing portion G of FIG. 24(a) showing a bearing portion on the right.
Figure 24E:
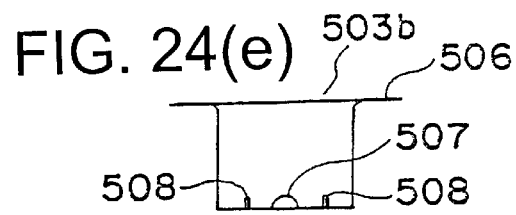
FIG. 24(e) is an enlarged view showing portion H of FIG. 24(a) showing a bearing portion on the left.
Figure 25A:
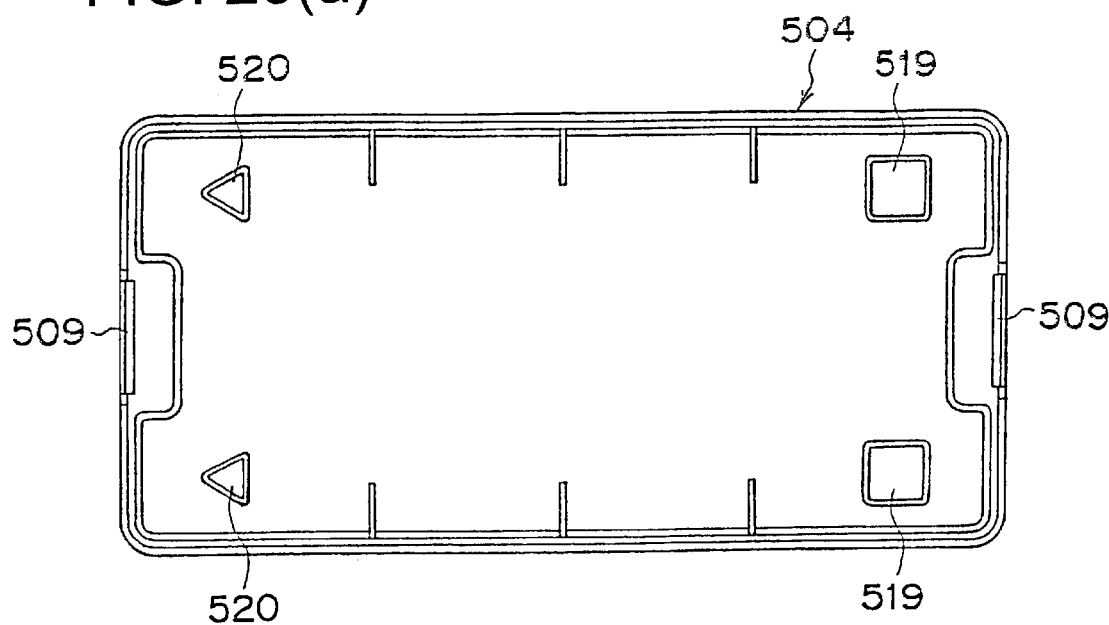
FIG. 25(a) is a plan view showing an upper cover.
Figure 25B:
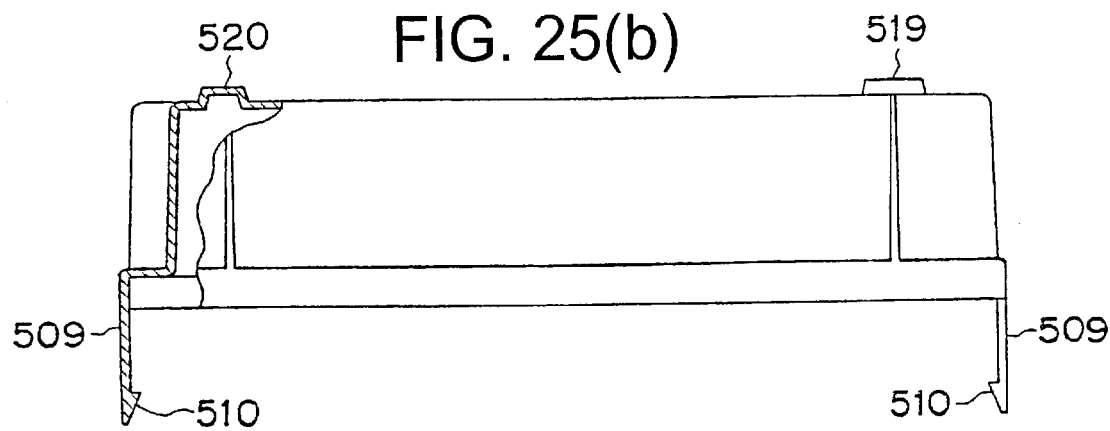
FIG. 25(b) is a partially cross-sectional front view.
Figure 25C:
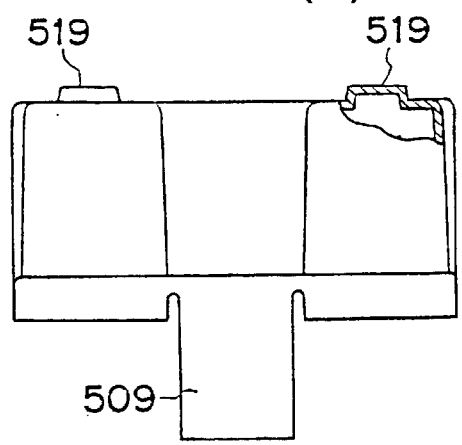
FIG. 25(c) is a partially cross-sectional side view.
Figure 26A:
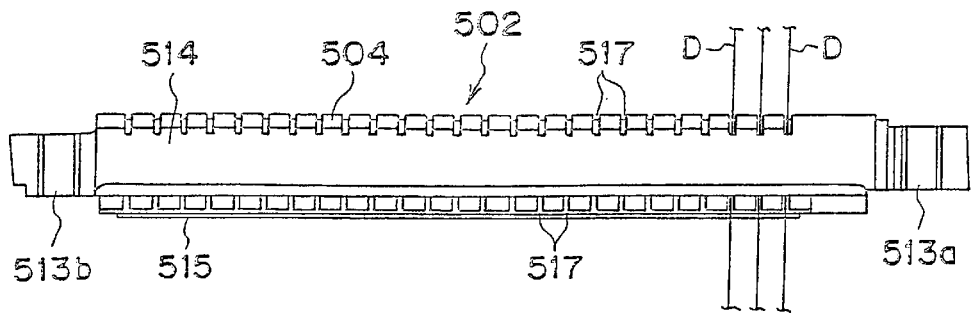
FIG. 26(a) is a front view showing an embodiment of a holder.
Figure 26B:
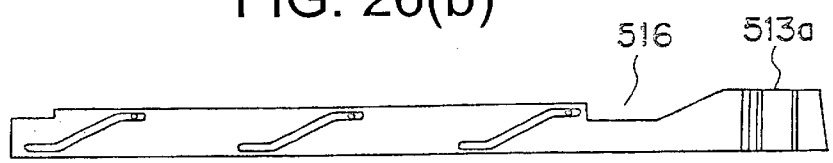
FIG. 26(b) is a front view showing a cam actuator.
Figure 26C:
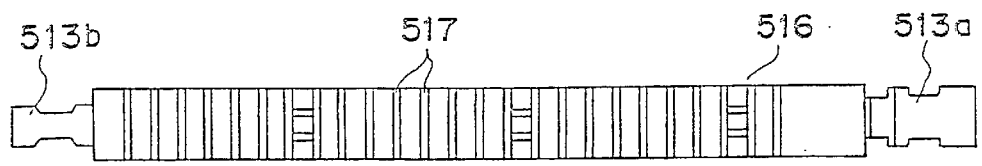
FIG. 26(c) is a plan view showing the holder.
Figure 26D:
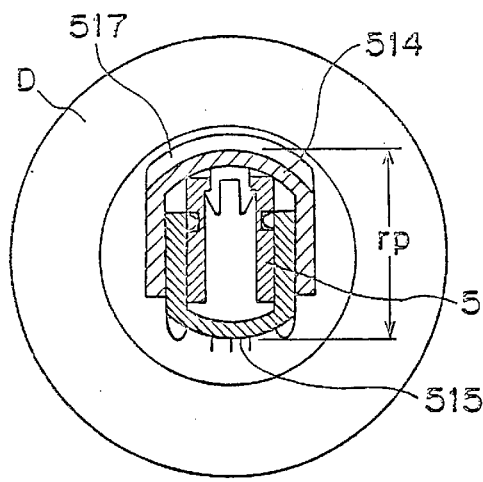
FIG. 26(d) is a view showing the contracted diameter position of the holder.
Figure 26E:
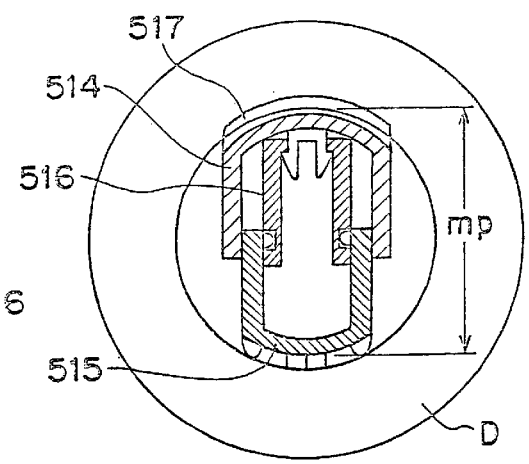
FIG. 26(e) is a view showing the expanded diameter position of the holder.

Referring to FIG. 25, the upper cover 504 is provided integrally with a tongue end portion 509 that extends downwardly on the center of the both end portions (the right and left ends of FIG. 25(*a*)), with a claw 510 formed on the lower rim of the tongue end portion 509. On the other hand, as shown in FIG. 24, the lower cover 505 is provided, on the both end rims thereof, with a backing plate 511, with a hook portion 512 for hooking the claw 510 formed on the lower rim of the backing plate 511. The claw 510 and the hook portion 512 may be conversely related to each other.

In FIG. 23, the holder 502 is inserted into the axle hole D1 of the disk D to hold a plurality of disks D, D ... in the shape of a row, suspended horizontally within the hollow portion of the box 501 by being held at the both ends by means of the bearing portion of the box 501.

In FIGS. 26(*a*) to (*c*), the holder is provided, on the both ends thereof, with grips 513*a* and 513*b*. The holder may employ, for example, the disk holder described in the embodiment 3. As shown in FIG. 26, this holder has a first core 514, a second core 515, and a cam actuator 516, and is a disk holder to be inserted into the axle hole D1 of the disk D to hold a plurality of disks D, D ... in a row at intervals. Each of the first and second cores 514 and 515 is a member having a given length with a generally U-shaped cross section, opposed to and combined with each other so that the outer diameter can be expanded or contracted between the expanded diameter position mP and the contracted diameter position rP.

As shown in FIG. 26(*e*), the expanded diameter position mP is the position where the inner periphery of the axle hole of the disk D is supported by part of the circumference surface of the second core 502. As shown in FIG. 26(*d*), the contracted diameter position rP is the position where the holder 502 is inserted into or retracted from the axle hole D1 of the disks Each of the cores 514 and 515 have the rows of 517 on the outer surface thereof. The rows of the guides 517 form flutes for receiving the disks D one by one inbetween the guides 517 to hold disks D at predetermined intervals. The cam actuator 516 is held by means of the first core 514 and inserted movably lengthwise into the cylinder of the holder into which the first and second cores 514 and 515 are combined with each other. The cam actuator 516 supports the second core at two or more points to keep the cores parallel to each other and switches the combination of the first core 514 and the second core 515 between the expanded diameter position and the contracted diameter position.

The disk holder described in embodiment 5 of the present invention is provided, on the end portion of the first core 514, with a knob (513b), whereas the cam actuator 516 inserted into the holder is provided, the outer end thereof, with a grip 513a. Therefore, the grip is to insert the cam actuator 516 into and withdraw it from the holder, however, the knob 513b is a dummy grip.

When a robot is used for the operation, the grip is pulled with the knob fixed or is pressed against the holder side to switch between the expanded diameter position mP and the contracted diameter position rP.

In embodiment 5 of the present invention, for convenience in explanation, it is to be understood that the rectangular grips 513a and 513b are provided on the both ends of the holder.

The holder 502 is fixedly held on the box 501 by inserting the grips 513a and 513b from above the lower cover into the recesses provided on the bearing portions 503a and 503b.

Figure 27:
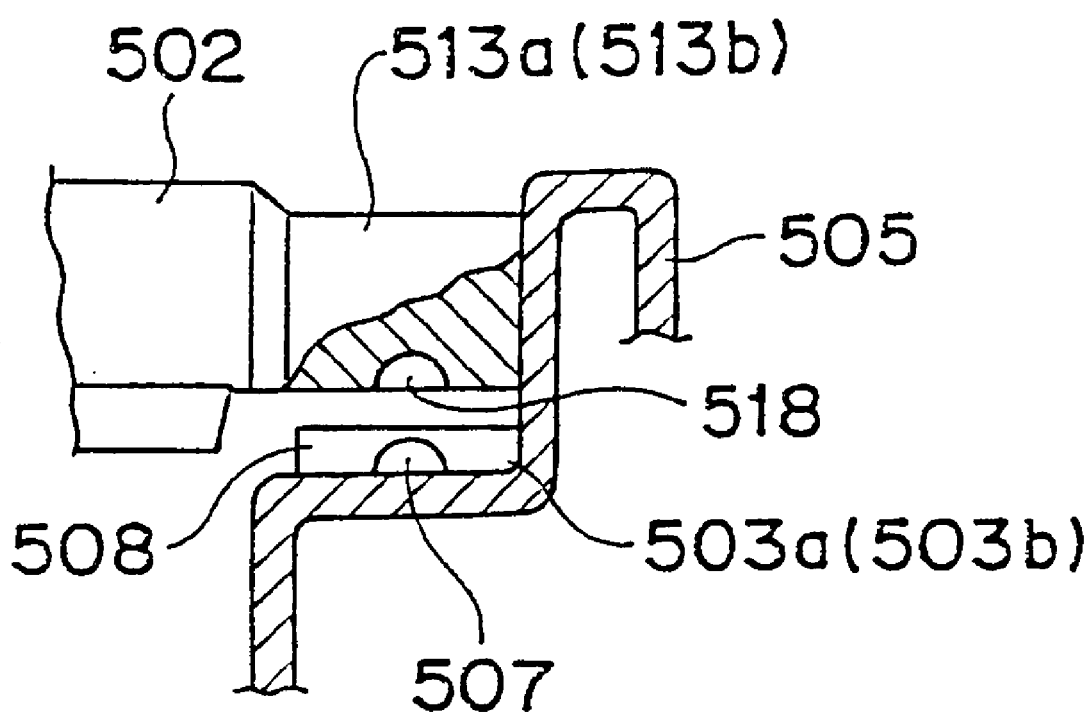
FIG. 27 is a view showing how to insert the grip of the holder into a bearing portion.
Figure 28:
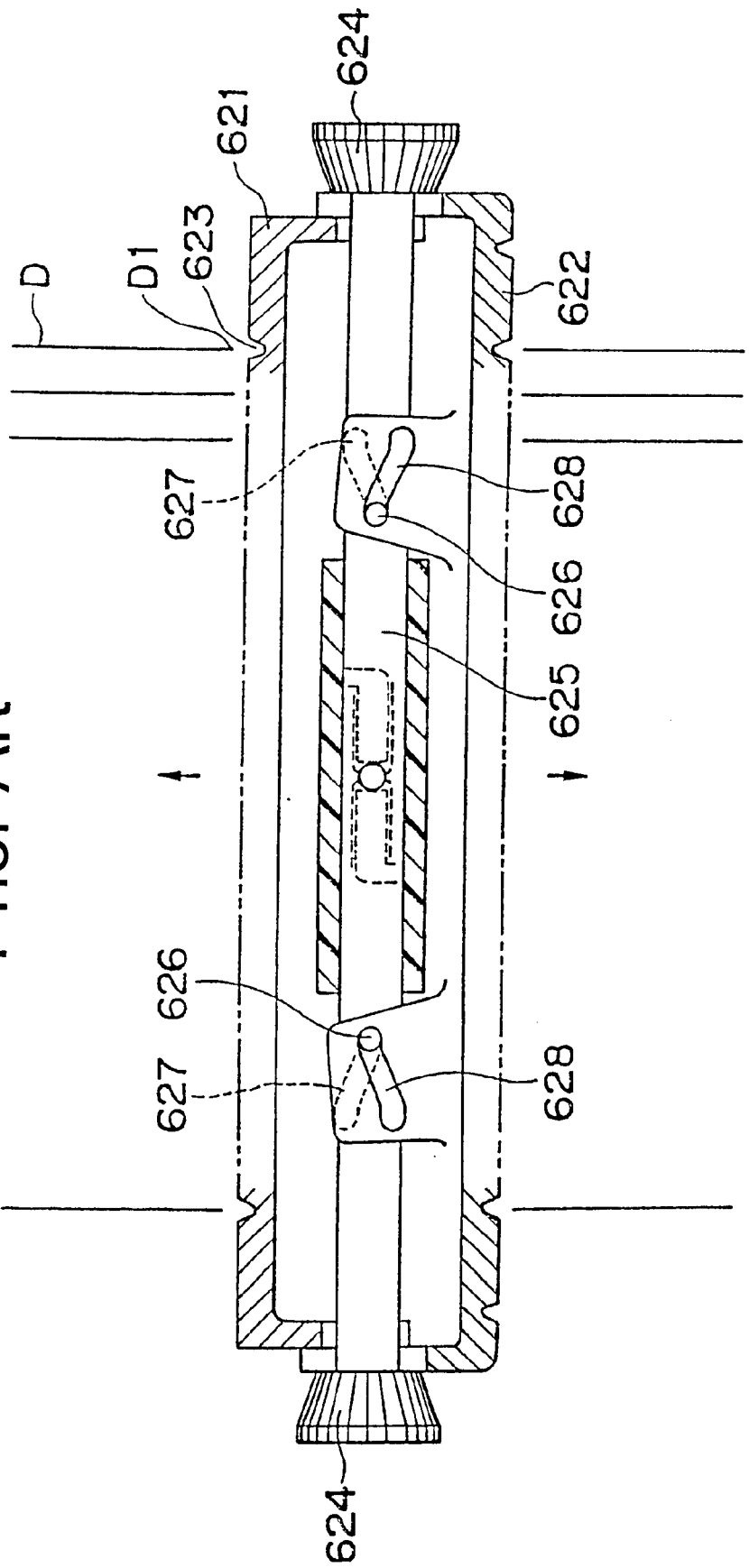
FIG. 28 is a view showing a prior art example of a disk holder.

The grips 513a and 513b are allowed to engage the recesses of the bearing portions 503a and 503b to be prevented from rotating, and a small hole 518 is opened, on the lower surface of the grips 513a and 513b for engaging the projected piece 507 of the recess as shown in FIG. 27.

Moreover, in the present invention, the grips 513a and 513b on the both ends of the holder 502 are different in shape from each other. In this embodiment, the lateral width of the grip 503a on one end (on the right) of the holder 502 is formed to be larger than that of the grip 503b on the other end (on the left). The lateral width of the recess forming the bearing portion 503a on one end side (the middle right side in FIG. 24) of the box is correspondingly set to be larger than that of the recess forming the bearing portion 503b on the other fend (the middle left side in FIG. 24).

Therefore, the grip 513a on the right of the holder 502 can be inserted into the recess of the bearing portion 503a on the right of the box 501 but cannot be inserted into the recess of the bearing portion 503b on the left. That is, the shapes of the bearing portions 503a and 503b of the box 501 are set to the shape of the grips 513a and 513b to be received, respectively, and the direction of insertion of the holder 502 into the box 501 is determined uniquely.

Furthermore, the upper surface of the upper cover 504, which is to be the upper surface of the box 501, and the lower surface of the lower cover 505, which is to be the lower surface of the box 501, are provided, on the both end portions in the longitudinal direction, with stack sustain portions 519 and 520 of a projection and a depression, which engage with each other when two or more boxes are stacked. In this embodiment, the upper surface of the upper cover is provided with the stack sustain portions 519 and the projection of 520, while the lower surface of the lower cover is provided with the stack sustain portion 519 and the depression of 520.

The shape of the stack sustain portion on one end portion side (on the right) and that of the stack sustain portion on the other end portion side (on the left) are different from each other. In this embodiment, as shown in FIG. 24(a) and FIG. 25(a), the planar shape of projection and depression of the stack sustain portion 519 on the right is set to a rectangle, while the planar shape of projection and depression of the stack sustain portion 520 on the left is set to a triangle.

The lower cover 505 and the upper cover 504 can be fit to each other only when the planar shapes of projection and depression of the stack sustain portions 519 and 520 coincide with each other and thus different planar shapes of projection and depression would allow no fitting to each other. Therefore, the direction of stacking the lower cover 505 and the upper cover 504 is determined uniquely.

When the container according to the present invention is used for transportation, the holder 502 is first inserted into the axle hole of two or more disks D, D . . . to arrange the two or more disks D, D . . . in a row to be held on the circumference of the holder 502.

Then, the grips 513a and 513b of the holder 502 are fit into the bearing portions 503a and 503b, which are provided on the both ends of the lower cover 505, respectively. The shapes of the grips 513a and 513b, which are provided on the both ends of the holder 502, are different from each other and the recesses of the bearing portions for receiving the grips 513a and 513b are specified. Accordingly, this determines a unique direction of insertion of the holder 502 into the lower cover 505.

The small holes 518 of the grips 513a and 513b, which are inserted into the recesses of the bearing portions 503a and 503b, fit into the projected pieces 507 in the recesses and thus positioned. Moreover, being subjected to the pressure of insertion of the grips 513a and 513b, the minute ribs 508 in the recesses are deformed. This decreases the clearance of the grips 513a and 513b in the recesses, providing improved holding stability.

Subsequently, the opening of the lower cover 505 is covered with the upper cover 504. At this time, it is confirmed that the shapes of the depressed portions of the stack sustain portions 519 and 520 provided on the right and left of the lower cover 505 are the same as those of the projected portions of the stack sustain portions 519 and 520 on the right and left of the upper cover. Then, the direction of the upper cover 504 is determined and stacked on the lower cover 505. Furthermore, the shape of the right and left or the front and back of the upper and lower covers can be made asymmetric by providing part of the opening rim of the lower cover 505 and part of the opening rim of the upper cover with a projected piece and a small hole (either of which are not shown) for receiving the projected piece. The direction of combination of the lower cover 505 and the upper cover 504 can thereby be determined uniquely.

After the direction of combination of the lower cover 505 and the upper cover 504 is decided, lowering the upper cover 504 causes the tongue end portion 509 of the upper cover 504 to be lowered along the backing plate 511 and warped due to the resilience that it has by itself. Thus, at the distal end thereof, the claw 510 is hooked by means of the hook portion 512, thereby allowing the upper cover 504 to engage the lower cover 505 detachably. The claw 510 on the lower rim of the tongue end portion 509 is hooked, by so-called snap-fit, on the hook portion 512 of the backing plate 511 of the lower cover 505, thereby allowing the upper cover 504 to be coupled to the lower cover 505. This allows the disks D, D . . . held on the holder 502 to be accommodated in the hollow portion of the box without being in contact with the inner wall of the box 501.

When boxes in which disks D, D . . . are accommodated or vacant boxes are stacked, since the boxes cannot be fit to each other unless the planar shapes of projection and depression of the stack sustain portions 519 and 520 coincide with each other, the boxes on top of the other can be aligned in the same direction by themselves. Consequently, the holder 502 inside the box 501 should be naturally aligned in the same direction. Furthermore, in FIG. 24, the lower cover 505 is provided, on the both sides of the center on the lower surface thereof in the longitudinal direction, with a mark 521 for center positioning by the depressed portion.

When the container according to the present invention is employed for use in manufacturing processes, the upper cover 504 can be removed from the lower cover 505 to be moved on work lines. At this time, the mark 521 that is provided on the lower cover 505 can be used as a center positioning mark for automatic devices in the work processes. Moreover, the shape of the depressed portions of the stack sustain portions 519 and 520 can be used as a mark for checking the direction of flow of the line.

According to embodiment 5 of the present invention as described above, the container comprises the combination of the box and the holder. The condition of the disks accommodated inside the box can be easily checked from outside by making the box of a transparent resin material. In addition, the box is adapted to suspend the holder in the hollow portion thereof to prevent the circumference rim of a plurality of disks that are held on the circumference of the holder from being brought into contact with the inner wall of the box. This prevents the disks from being damaged and thus eliminates unusable portions of the disks, thereby ensuring a large storing area.

Furthermore, the box is a combination of the upper cover and the lower cover, which are detachably coupled to each other by snap-fit and facilitate putting the holder into or taking it out of the box. Moreover, a holder can be suspended in the box in a unique direction when accommodated in the box, and boxes stacked on top of the other can be aligned in one direction. Accordingly, when automating operations by means of a robot such as putting the holder into or taking it out of the box, holding disks on the holder, or attaching disks to and detaching disks from the holder, the handling operations can be standardized.

INDUSTRIAL APPLICATION

According to the disk holder of the present invention as described above, the switching between the expansion and the contraction of the cylinder can be carried easily, thus providing increased stability in holding disks.

According to the disk container of the present invention as described above, the disk container is stored in the disk holder for holding disks, and can be used for transportation or manufacturing process.

What is claimed is:

1. A disk holder which comprises a first core and a second core, which is inserted into an axle hole of a disk, and which supports a plurality of disks at intervals in a row, wherein each of said cores has a given length with a generally U-shaped cross section and is combined to oppose each other so that adjustment of expansion and contraction of the cores can be carried out between an expanded diameter position where an inner periphery of the axle hole of the disk is supported by parts of a circumference surface of the holder, and a contracted diameter position where the holder is inserted into and withdrawn from the axle hole of the disk, each of the cores has rows of guides and supports on an outer surface thereof so that the rows of the guides form flutes for supporting the disks at predetermined intervals by receiving the disks one by one inbetween the guides, and the supports are projected rows for supporting the inner periphery of the axle hole of each of the disks as multi-point support, said first core having two rows of the supports and said second core having one row of supports.

2. The disk holder according to claim 1, wherein each of the cores has leg portions and a curved surface portion, the leg portions are formed in a pair and combined so that the leg portions of the first core are sandwiched inbetween the leg portions of the second core to enable adjustment of expansion and contraction to each other, the curved surfaces of both cores are portions to be aligned with the inner periphery of the axle hole of the disk at the expanded diameter position, and the rows of the guides and supports are formed on the curved surface of each of the cores.

3. The disk holder according to claim 1, wherein each of the rows of the guides is formed on two ends of the curved surface portion of each of the cores, the supports of the first core are formed in the flutes inbetween the guides of each of the rows, and the supports of the second core are formed in a middle position between two rows of the guides.

4. The disk holder according to claim 1, wherein the supports of the second core are provided with resiliency, and at the expanded diameter position of both the cores, the supports of the second core support the inner periphery of the axle hole of the disk against the resiliency which they own.

5. The disk holder according to claim 4, wherein the support of the second core has resiliency due to a material of the core.

6. A disk holder which comprises a first core and a second core, which is inserted into an axle hole of a disk, and which supports a plurality of disks at intervals in a row, wherein each of the first and second cores has a given length with a generally U-shaped cross section and is combined to oppose each other so that adjustment of expansion and contraction of the cores can be carried out between an expanded diameter position where an inner periphery of the axle hole of the disk is supported by parts of a circumference surface of the holder, and a contracted diameter position where the holder is inserted into and withdrawn from the axle hole of the disk, each of the cores has rows of guides and supports on an outer surface thereof so that the rows of the guides form flutes for supporting the disks at predetermined intervals by receiving the disks one by one inbetween the guides, the supports comprise rigid supports and elastic supports, the rigid supports are to be brought into contact with parts of the inner periphery of the axle hole of each of the disks, and the elastic supports have deflectivity and deflect to be deformed by being subjected to weight to act repulsive force caused by the deformation upon the inner periphery of the axle hole of the disk, said first core having two rows of the supports and said second core having one row of supports.

7. The disk holder according to claim 6, further comprising a cam actuator, wherein the cam actuator is inserted into openings on two ends of a combination of the first core and the second core, and is slid in and out to change the combination of the first core and the second core into the expanded diameter position and the contracted diameter position, and the first core and the second core are not provided with an opening for letting out dust particles produced by rubbing caused by displacement of expansion and contraction between both cores and rubbing between the cores and the cam actuator.

8. The disk holder according to claim 7, wherein the cam actuator has cam flutes and is coupled slidably to the first core, the cam flutes receive cam pins protruded toward an inner surface of the second core and expand or contract the combination of the first core and the second core in accordance with displacement of the cam actuator into or out of the holder, and the first core and the second core are coupled via the cam actuator to each other without an opening provided on outer surfaces thereof.

9. The disk holder according to claim 6, wherein each of the rows of guides is formed on two end rims of curved surfaces along a longitudinal direction of the first and second cores, the supports of the first core are rigid supports and formed in the flutes inbetween the guides of each of the rows, and the supports of the second core are elastic supports and are thin ribs formed inbetween the two rows of guides.

10. The disk holder according to claim 6, wherein the first core has elastic supports in addition to the rigid supports, and the elastic supports formed on the first core are thin ribs dispersively formed on a curved portion.

11. The disk holder according to claim 10, wherein the elastic supports of the core has resiliency which a material of the core has.

12. A disk holder which comprises a first core, a second core, and one cam actuator, which is inserted into an axle hole of a disk, and which supports a plurality of disks at intervals in a row, wherein each of the first and second cores has a given length with a generally U-shaped cross section and is combined to oppose each other to have a cylindrical shape so that adjustment of expansion and contraction of the cores can be carried out between an expanded diameter position where an inner periphery of the axle hole of the disk is supported by parts of a circumference surface of the holder, and a contracted diameter position where the holder is inserted into and withdrawn from the axle hole of the disk, each of the cores has rows of guides and supports on an outer surface thereof so that the rows of the guides form flutes for supporting the disks at predetermined intervals by receiving the disks one by one inbetween the guides, the one cam actuator is supported by the first core and inserted movably from an opening at one end of a cylinder of the holder combined by the first and second cores in a longitudinal direction so that the cam actuator supports the second core at at least two points, keeps the cores parallel to each other, and switches the first core and the second core between the expanded diameter position and the contracted diameter position, a direction of the holder being distinguished by presence of the cam actuator.

13. The disk holder according to claim 12, wherein the cam actuator has at least two cam grooves in the longitudinal direction, and each of the cam grooves receives cam pins projected on the second core, guides the cam pins simultaneously by means of displacement of the cam actuator in the cylinder of the holder, and moves the second core to the expanded diameter position by pushing the second core while keeping the second core in parallel to the first core or displace the second core to the contracted diameter position by retracting the second core from the expanded diameter position while keeping the second core in parallel to the first core.

14. The disk holder according to claim 13, wherein the cam actuator comprises a knob and a shaft, the shaft is inserted into the cylinder of the holder, with which the first and second cores are combined, along a generally entire length thereof, and the cam grooves are formed at least on a central portion and right and left sides of the shaft, each of which receives the cam pin projected on the second core.

15. The disk holder according to claim 14, wherein on an end portion on a side of the cylinder of the holder where the cam actuator is not inserted, a grip corresponding to the knob of the cam actuator is integrated with the first core.

16. The disk holder according to claim 12, wherein each of the first and second cores has leg portions and a curved surface portion connecting the leg portions, each of the leg portions being a bar member having a given length with a generally U-shaped cross section, the rows of guides of the first core are formed in the shape of an arc on a circumference of the curved surface portion, while the rows of guides of the second core are formed at two ends of the curved surface portion, the second core has additional supports, and the additional supports support the inner periphery of the axle hole of the disk and are thin ribs formed on the curved surface portion between the rows of guides of the second core.

17. A disk holder having a combination of a core, supports, and a cam actuator, to support a plurality of disks in parallel, wherein the core is a holder portion to be inserted into axle holes of two or more disks, the supports have projected rows and a resilient portion, the projected rows are portions to be protruded from inside the core to outside the core in a shape of a rib to support the inner periphery of the axle hole of the disk, provided on the resilient portion, the resilient portion is made of an elastic material and has a self-restoring property, and the cam actuator forcibly deforms the resilient portion to allow the projected rows to protrude outside the core and conversely, releases the forced deformation of the resilient portion to allow the projected rows to retract into the core.

18. The disk holder according to claim 17, wherein the forcibly deformed resilient portion has an action to push up the projected rows which support disks by elastic force which they own.

19. The disk holder according to claim 17, wherein the projected rows are provided with flutes for receiving parts of outer circumference rims of the disks inserted onto the core to prevent the disks adjacent to each other from being brought into contact with each other.

20. A disk holder having a combination of a core, supports, and a cam actuator, to support a plurality of disks in parallel, wherein the core is a holder portion to be inserted into axle holes of two or more disks, having a guide surface with a resilient portion inside the core, the supports have projected rows and a resilient portion, the projected rows are portions to protrude from inside the core to outside the core to support inner peripheries of the axle holes of the disks, provided on the resilient portion, the resilient portion is made of an elastic material having a curved surface bent in a shape of an arc, having a self-restoring property, and inserted in the core, and the cam actuator presses the curved surface of the resilient portion against the guide surface of the core to forcibly deform the shape of the curved surface to allow the projected rows to protrude out of the core and conversely, releases forced deformation of the resilient portion to allow the projected rows to retract into the core.

21. A disk holder having a combination of a core, supports, and a cam actuator, to support a plurality of disks in parallel, wherein the core is a cylinder having a curved surface on an inner surface of an axle hole and has slits in an axial direction, the supports have projected rows and a resilient portion, the projected rows are portions to protrude from inside the core onto a circumference of the core in a shape of a rib through the slits to support inner peripheries of axle holes of the disks, the resilient portion is made of an elastic material having a curved surface in a shape of an arc in a cross section thereof and has a self-restoring property and is inserted into the axle hole of the core, the curved surface of the resilient portion is greater in radius than the axle hole of the core, and the projected rows are provided on a convex surface of the curved surface of the resilient portion, and the cam actuator is inserted into the axle hole of the core at least from an opening on one end of the core and forcibly deforms the curved surface of the resilient portion along the curved surface of the axle hole of the core to allow the projected rows to protrude onto a circumference of the core, and conversely, is drawn out of the core and releases the resilient portion to allow the projected rows to retract into the core.

22. The disk holder according to claim 21, wherein the resilient portion is inserted into the axle hole of the core in a pair, and the cam actuator is inserted inbetween the paired resilient portions and displaced in the axial direction, thereby expanding or contracting a diameter of the paired resilient portions.

23. The disk holder according to claim 21, wherein the cam actuator comprises a projected-row extruding manipulation portion of a comparatively large diameter and a projected-row retracting manipulation portion of a comparatively small diameter, which are formed in a given range of axis of the cam actuator, the projected-row extruding manipulation portion is a portion which presses the resilient portion against an inner diameter of the axle hole of the core to deform the resilient portion forcibly to allow the projected rows to protrude out of the core, and the projected-row retracting manipulation portion is a portion which releases at least a part of a forced deformation of the resilient portion, and with the part of the resilient portion engaged with the slits, retracts the projected rows into the core.

24. A disk container having a combination of a box and a holder, wherein the box is a hollow container which can be opened and closed, and provided inside the box with a hollow portion to accommodate disks, and bearing portions for holding the holder, the bearing portions are recesses formed opposite to an opposing rim of the box, the holder holds a plurality of the disks in a row by being inserted into axle holes of the disks, and two ends of the holder are suspended in the hollow portion of the box by being supported on the bearing portions of the box, the holder has grips on two ends thereof, which engage the recesses of the bearing portions to prevent the grips from being turned, shapes of the grips provided on the ends of the holder being different from each other, shapes of the recesses provided on the bearing portions of the box are set in accordance with the shape of the grips, and a direction of insertion of the holder into the box is predetermined, and the disks held on the holder are accommodated in the hollow portion of the box without contacting an inner wall of the box.

25. The disk container according to claim 24, wherein upper and lower surfaces of the box are provided with stack sustain portions, formed on both end portions lengthwise, of projection and depression to be fitted to each other when two or more boxes are stacked on top of the other, a shape of a stack sustain portion on one end side and that of a stack sustain portion on the other end side are different from each other, and a direction of stacking a lower box and an upper box is predetermined.

26. The disk container according to claim 24, wherein the box has a combination of an upper cover and a lower cover, the upper cover and the lower cover are containers with one surface thereof opened, the upper cover forms an upper surface of the box, while the lower cover forms a lower surface of the box, respectively, the upper cover and the lower cover are coupled detachably to each other, with opening rims opposed to each other, in order to form a sealed hollow condition, and the bearing portions are provided on parts of the opposing opening rims of the lower cover so as to face each other.

27. The disk container according to claim 24, wherein the upper cover and the lower cover have a claw on one cover and a hook portion on the other cover, and the upper cover and the lower cover are coupled detachably to each other by hooking the claw to the hook portion.

* * * * *